(12) United States Patent
Rieutort-Louis et al.

(10) Patent No.: US 12,201,004 B2
(45) Date of Patent: Jan. 14, 2025

(54) METHODS AND CONFIGURATIONS FOR IMPROVING THE PERFORMANCE OF SENSORS UNDER A DISPLAY

(71) Applicant: Apple Inc., Cupertino, CA (US)

(72) Inventors: Warren S. Rieutort-Louis, Cupertino, CA (US); Woo Shik Jung, San Jose, CA (US); Abbas Jamshidi Roudbari, Saratoga, CA (US); Shin-Hung Yeh, Taipei (TW); Christopher E. Glazowski, Santa Cruz, CA (US); Jean-Pierre S. Guillou, Los Gatos, CA (US); Yuchi Che, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 686 days.

(21) Appl. No.: 17/440,429

(22) PCT Filed: Apr. 8, 2020

(86) PCT No.: PCT/US2020/027195
§ 371 (c)(1),
(2) Date: Sep. 17, 2021

(87) PCT Pub. No.: WO2020/219267
PCT Pub. Date: Oct. 29, 2020

(65) Prior Publication Data
US 2022/0165814 A1    May 26, 2022

Related U.S. Application Data

(63) Continuation of application No. 16/825,978, filed on Mar. 20, 2020, now abandoned.
(Continued)

(51) Int. Cl.
*H10K 59/121*    (2023.01)
*H10K 59/131*    (2023.01)
(Continued)

(52) U.S. Cl.
CPC .......... *H10K 59/65* (2023.02); *H10K 59/121* (2023.02); *H10K 59/131* (2023.02); *H10K 59/353* (2023.02); *H10K 59/40* (2023.02)

(58) Field of Classification Search
CPC .... H10K 59/65; H10K 59/353; H10K 59/121; H10K 59/131
See application file for complete search history.

(56) References Cited

U.S. PATENT DOCUMENTS 9,214,507 B2    12/2015    Matthew et al.
10,163,984 B1   12/2018    Ho et al.
(Continued)

FOREIGN PATENT DOCUMENTS

CN    206451466 U    8/2017
CN    107870689 A    4/2018
(Continued)

*Primary Examiner* — Douglas M Menz
(74) *Attorney, Agent, or Firm* — Treyz Law Group; Jason Tsai

(57) ABSTRACT

An electronic device may include a display and a sensor under the display. The display may include an array of subpixels for displaying an image to a user of the electronic device. At least a portion of the array of subpixels may be selectively removed in a pixel removal region to improve optical transmittance to the sensor through the display. The pixel removal region may include a plurality of pixel free regions that are devoid of thin-film transistor structures, that are devoid of power supply lines, that have continuous open areas due to rerouted row/column lines, that are partially devoid of touch circuitry, that optionally include dummy contacts, and/or have selectively patterned display layers.

28 Claims, 25 Drawing Sheets

Related U.S. Application Data

(60) Provisional application No. 62/837,628, filed on Apr. 23, 2019.

(51) Int. Cl.
    *H10K 59/35*     (2023.01)
    *H10K 59/40*     (2023.01)
    *H10K 59/65*     (2023.01)

(56) References Cited

U.S. PATENT DOCUMENTS

| | | |
|---|---|---|
| 2015/0200239 A1 | 7/2015 | Jung |
| 2016/0147346 A1 | 5/2016 | Lee et al. |
| 2018/0089485 A1 | 3/2018 | Bok |
| 2018/0129328 A1 | 5/2018 | Park et al. |
| 2019/0079236 A1 | 3/2019 | Hung |
| 2019/0310724 A1 | 10/2019 | Yeke Yazdandoost et al. |
| 2019/0373166 A1* | 12/2019 | Jia ................. G09G 3/2003 |
| 2020/0258947 A1* | 8/2020 | Chung ............. H10K 59/131 |

FOREIGN PATENT DOCUMENTS

| | | |
|---|---|---|
| CN | 108269840 A | 7/2018 |
| CN | 108389879 A | 8/2018 |
| CN | 207800041 U | 8/2018 |
| CN | 108847415 A | 11/2018 |
| CN | 109192759 A | 1/2019 |
| CN | 109207920 A | 1/2019 |
| CN | 109348012 A | 2/2019 |
| CN | 109378316 A | 2/2019 |
| CN | 109600459 A | 4/2019 |
| CN | 110444125 A | 11/2019 |
| CN | 110603578 A | 12/2019 |
| CN | 110648620 A | 1/2020 |
| CN | 110649081 A | 1/2020 |
| CN | 110751900 A | 2/2020 |
| CN | 110767147 A | 2/2020 |
| CN | 110767709 A | 2/2020 |
| CN | 110854296 A | 2/2020 |
| EP | 3300067 A2 | 3/2018 |
| EP | 3627214 A1 | 3/2020 |
| JP | 2017058671 A | 3/2017 |
| JP | 2018141947 A | 9/2018 |
| KR | 20140023223 A | 2/2014 |
| KR | 20160098551 A | 8/2016 |
| KR | 20180033361 A | 4/2018 |
| KR | 20190041553 A | 4/2019 |
| TW | 201839977 A | 11/2018 |
| WO | 2018087625 A1 | 5/2018 |
| WO | 2019080591 A1 | 5/2019 |
| WO | 2019137019 A1 | 7/2019 |

\* cited by examiner

METHODS AND CONFIGURATIONS FOR IMPROVING THE PERFORMANCE OF SENSORS UNDER A DISPLAY

This application claims priority to U.S. patent application Ser. No. 16/825,978, filed on Mar. 20, 2020, and U.S. provisional patent application No. 62/837,628, filed Apr. 23, 2019, which are hereby incorporated by reference herein in their entireties.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. A pixel removal region on the display may at least partially overlap with the sensor. The pixel removal region may include a plurality of non-pixel regions each of which is devoid of thin-film transistors. The plurality of non-pixel regions is configured to increase the transmittance of light through the display to the sensor. In one suitable arrangement, half of all display subpixels in the pixel removal region may be removed to increase the transmittance of light through the display to the sensor. In general, 10-90% of all display subpixels in the pixel removal region may be removed to increase the transmittance of light through the display to the sensor.

In accordance with an embodiment, a subset of all display subpixels in the pixel removal region may be removed by iteratively eliminating the nearest neighboring subpixels of the same color. The display may include more than one pixel removal region, which are of the same or different size/shape. The pixel removal region may cover an entire edge of the display. The pixel removal region may cover a corner of the display. The pixel removal region may cover a notch area in the display. The pixel removal region may also cover the entire display area. The pixel removal region may optionally cover any portion of the display.

The plurality of non-pixel regions may also be devoid of vertical power supply routing traces. If desired, at least some horizontal and vertical control lines in the plurality of non-pixel regions are rerouted to provide continuous open areas that reduce the amount of diffraction for light traveling through the display to the sensor. Each of the plurality of non-pixel regions may also be devoid of dummy contacts or may alternatively include dummy contacts to help provide emission current uniformity in the pixel removal region.

The electronic device may further include a conductive touch sensor mesh formed over the display. In one suitable arrangement, the conductive touch sensor mesh is not removed from the pixel removal region. In another suitable arrangement, the conductive touch sensor mesh is completely removed from the pixel removal region. In yet another suitable arrangement, the conductive touch sensor mesh is only partially removed from the pixel removal region. The display may further include a blanket layer that is selectively patterned in the pixel removal region to increase the transmittance of light through the display to the sensor. The blanket layer may be a display layer selected from the group consisting of: a substrate protection layer, a gate dielectric layer, an inorganic passivation layer, and an organic pixel definition layer.

DETAILED DESCRIPTION

Figure 1:
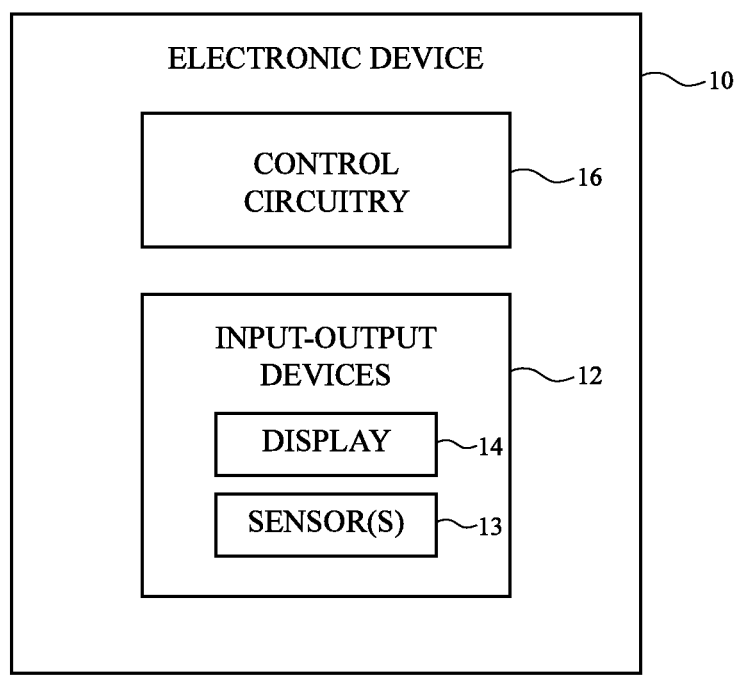
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology. Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2A:
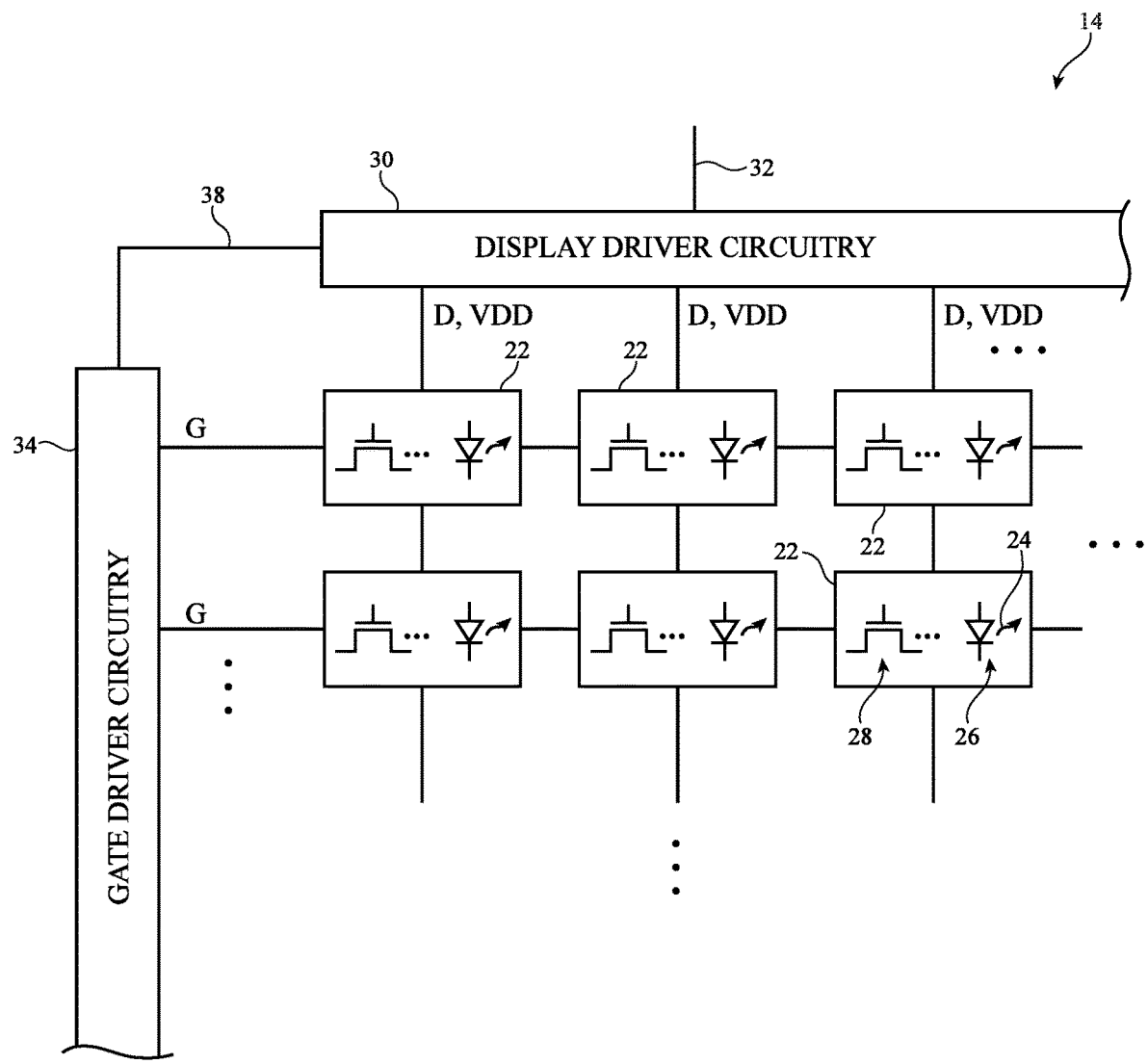
FIG. 2A is a schematic diagram of an illustrative display with light-emitting elements in accordance with an embodiment.

A top view of a portion of display 14 is shown in FIG. 2A. As shown in FIG. 2A, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2A may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 2B:
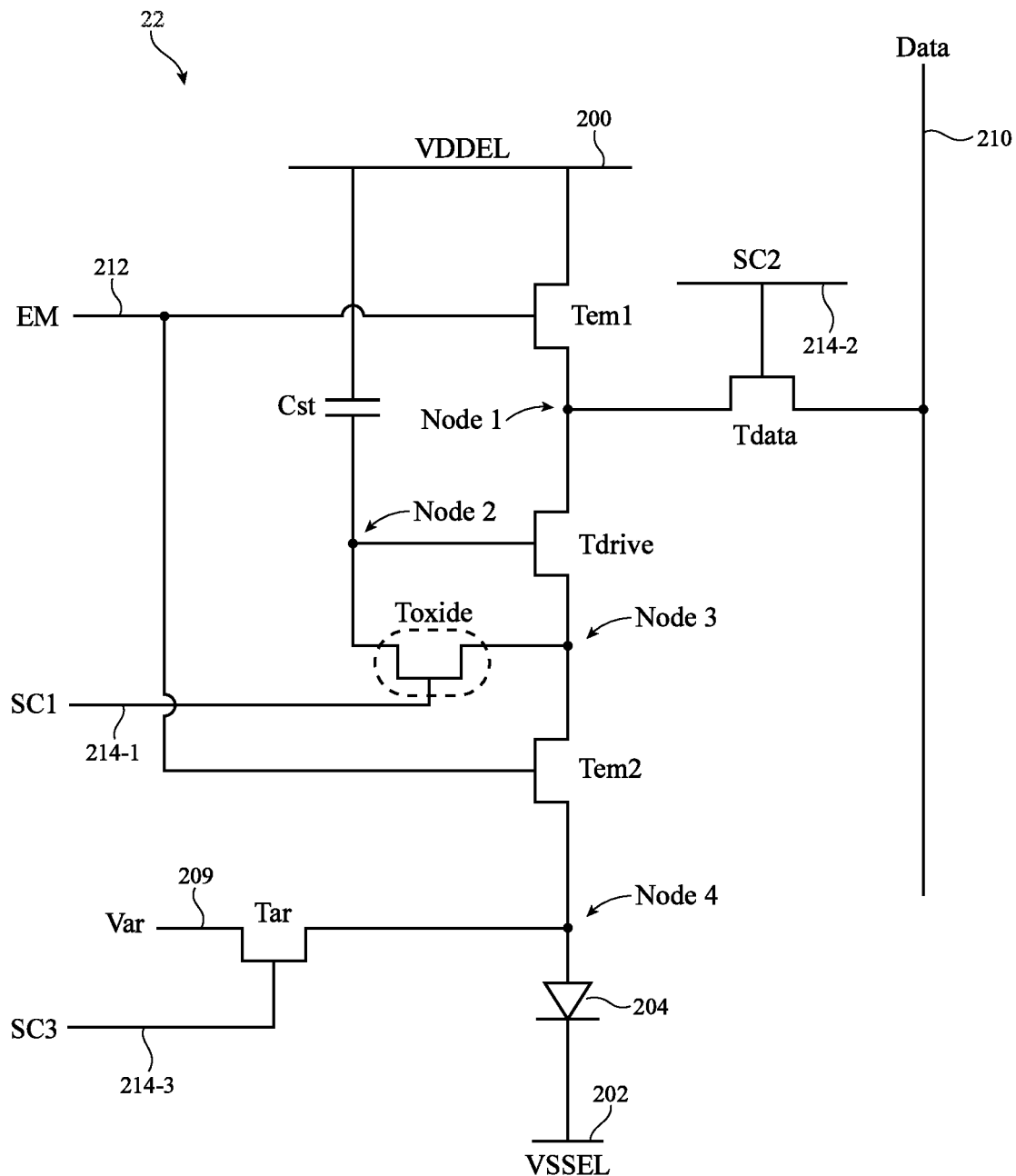
FIG. 2B is a circuit diagram of an illustrative display pixel in accordance with an embodiment.

FIG. 2B is a circuit diagram of an illustrative organic light-emitting diode display pixel 22 in display 14. As shown in FIG. 2B, display pixel 22 may include a storage capacitor Cst and associated pixel transistors such as a semiconducting-oxide transistor Toxide, a drive transistor Tdrive, a data loading transistor Tdata, a first emission transistor Tem1, second emission transistor Tem2, and an anode reset transistor Tar. While transistor Toxide is formed using semiconducting oxide (e.g., a transistor with an n-type channel formed from semiconducting oxide such as indium gallium zinc oxide or IGZO), the other transistors may be thin-film transistors formed from a semiconductor such as silicon (e.g., polysilicon channel deposited using a low temperature process, sometimes referred to as "LTPS" or low-temperature polysilicon). Semiconducting-oxide transistors exhibit relatively lower leakage than silicon transistors, so implementing transistor Toxide as a semiconducting-oxide transistor will help reduce flicker (e.g., by preventing current from leaking away from the gate terminal of drive transistor Tdrive).

In another suitable arrangement, transistors Toxide and Tdrive may be implemented as semiconducting-oxide transistors while the remaining transistors Tdata, Tem1, Tem2, and Tar are LTPS transistors. Transistor Tdrive serves as the drive transistor and has a threshold voltage that is critical to the emission current of pixel 22. Since the threshold voltage of transistor Tdrive may experience hysteresis, forming the drive transistor as a top-gate semiconducting-oxide transistor can help reduce the hysteresis (e.g., a top-gate IGZO transistor experiences less Vth hysteresis than a silicon transistor). If desired, any of the remaining transistors Tdata, Tem1, Tem2, and Tar may be implemented as semiconducting-oxide transistors. In general, any one of transistors Tdrive, Tdata, Tem1, Tem2, and Tar may be either an n-type (i.e., n-channel) or p-type (i.e., p-channel) silicon thin-film transistor. If desired, pixel 22 may include more or less than six transistors and/or may include more or less than one internal capacitor.

Display pixel 22 may include an organic light-emitting diode (OLED) 204. A positive power supply voltage VDDEL may be supplied to positive power supply terminal 200, and a ground power supply voltage VSSEL may be supplied to ground power supply terminal 202. Positive power supply voltage VDDEL may be 3 V, 4 V, 5 V, 6 V, 7 V, 2 to 8 V, or any suitable positive power supply voltage level. Ground power supply voltage VSSEL may be 0 V, −1 V, −2 V, −3 V, −4 V, −5 V, −6V, −7 V, or any suitable ground or negative power supply voltage level. The state of drive transistor Tdrive controls the amount of current flowing from terminal 200 to terminal 202 through diode 204, and therefore the amount of emitted light from display pixel 22. Organic light-emitting diode 204 may have an associated parasitic capacitance $C_{OLED}$ (not shown).

Terminal 209 may be used to supply an anode reset voltage Var to assist in turning off diode 204 when diode 204 is not in use. Terminal 209 is therefore sometimes referred to as an anode reset or initialization line. Control signals from display driver circuitry such as row driver circuitry 34 of FIG. 2A are supplied to control terminals such as row control terminals 212, 214-1, 214-2, and 214-3. Row control terminal 212 may serve as an emission control terminal (sometimes referred to as an emission line or emission control line), whereas row control terminals 214-1, 214-2, and 214-3 may serve as first, second, and third scan control terminals (sometimes referred to as scan lines or scan control lines). Emission control signal EM may be supplied to terminal 212. Scan control signals SC1, SC2, and SC3 may be applied to scan terminals 214-1, 214-2, and 214-3, respectively. A data input terminal such as data signal terminal 210 is coupled to a respective data line D of FIG. 2A for receiving image data for display pixel 22. Data terminal 210 may also be referred to as a data line.

In the example of FIG. 2B, transistors Tem1, Tdrive, Tem2, and OLED 304 may be coupled in series between power supply terminals 200 and 202. In particular, first emission control transistor Tem1 may have a source terminal that is coupled to positive power supply terminal 200, a gate terminal that receives emission control signal EM2 via emission line 212, and a drain terminal (labeled as Node1). The terms "source" and "drain" terminals of a transistor can sometimes be used interchangeably and may therefore sometimes be referred to as "source-drain" terminals. Drive transistor Tdrive may have a source terminal coupled to Node1, a gate terminal (labeled as Node2), and a drain terminal (labeled as Node3). Second emission control transistor Tem2 may have a source terminal coupled to Node3, a gate terminal that also receives emission control signal EM via emission line 212, and a drain terminal (labeled as Node4) coupled to ground power supply terminal 202 via light-emitting diode 204. Configured in this way, emission control signal EM can be asserted to turn on transistors Tem1 and Tem2 during an emission phase to allow current to flow through light-emitting diode 204.

Storage capacitor Cst may have a first terminal that is coupled to positive power supply line 200 and a second terminal that is coupled to Node2. Image data that is loaded into pixel 22 can be at least be partially stored on pixel 22 by using capacitor Cst to hold charge throughout the emission phase. Transistor Toxide may have a source terminal coupled to Node2, a gate terminal configured to receive scan control signal SC1 via scan line 214-1, and a drain terminal coupled to Node3. Signal SC1 may be asserted to turn on transistor Toxide to short the drain and gate terminals of transistor Tdrive. A transistor configuration where the gate and drain terminals are shorted is sometimes referred to as being "diode-connected."

Data loading transistor Tdata may have a source terminal coupled to data line 210, a gate terminal configured to receive scan control signal SC2 via scan line 214-2, and a drain terminal coupled to Node1. Configured in this way, signal SC2 can be asserted to turn on transistor Tdata, which will allow a data voltage from data line 210 to be loaded onto Node1. Transistor Tar may have a source terminal coupled to Node4, a gate terminal configured to receive scan control signal SC3 via scan line 214-3, and a drain terminal coupled to initialization line 209. Configured in this way, scan control signal SC3 can be asserted to turn on transistor Tar, which drives Node4 to the anode reset voltage level Var. If desired, the anode reset voltage Var on line 209 can be dynamically biased to different levels during operation of pixel 22.

Figure 3:
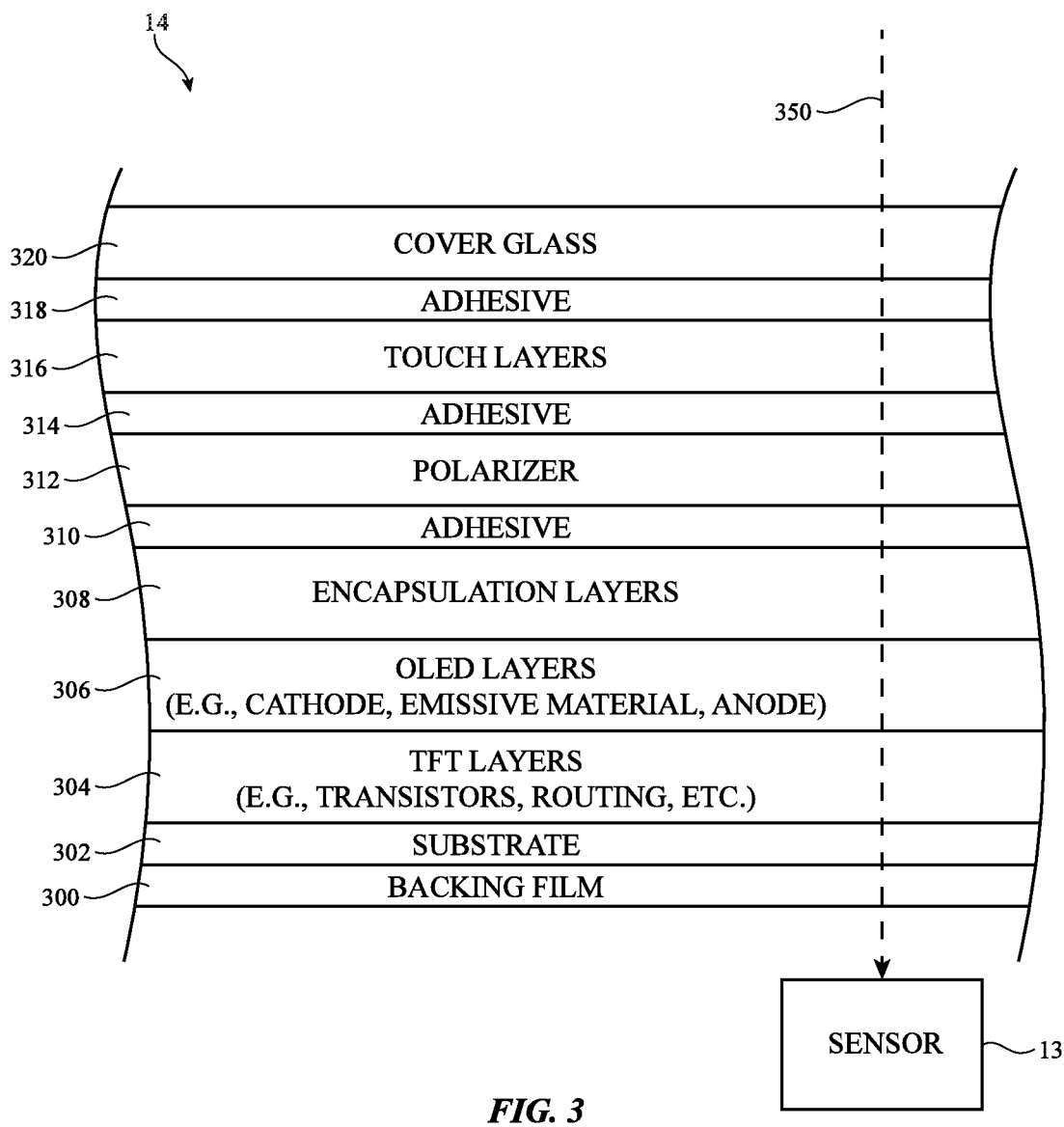
FIG. 3 is a cross-sectional side view of an illustrative display stack that at least partially covers a sensor in accordance with an embodiment.

Device 10 having a full-face display 14 covering the entire front face of the device may have to mount sensor 13 below display 14. FIG. 3 is a cross-sectional side view of an illustrative display stack of display 14 that at least partially covers a sensor in accordance with an embodiment. As shown in FIG. 3, the display stack may include a backing film 300 and a substrate such as substrate 302 formed on backing film 300. Substrate 302 may be formed from glass, metal, plastic, ceramic, sapphire, or other suitable substrate materials. In some arrangements, substrate 302 may be an organic substrate formed from polyimide (PI), polyethylene terephthalate (PET), or polyethylene naphthalate (PEN) (as examples). The surface of substrate 302 may optionally be covered with one or more buffer layers (e.g., inorganic buffer layers such as layers of silicon oxide, silicon nitride, etc.).

Thin-film transistor (TFT) layers 304 may be formed over substrate 302. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a coverglass layer 320 that is formed over the touch layers 316 using additional adhesive 318 (e.g., OCA material). Cover glass 320 may serve as an outer protective layer for display 14.

Still referring to FIG. 3, sensor 13 may be formed under the display stack within the electronic device 10. As described above in connection with FIG. 1, sensor 13 may be an optical sensor such as a camera (e.g., an infrared camera), proximity sensor, ambient light sensor, fingerprint sensor, or other light-based sensor. In such scenarios, the performance of sensor 13 depends on the transmission of light traversing through the display stack, as indicated by arrow 350. A typical display stack, however, has fairly limited transmission properties. For instance, more than 80% of light in the visible spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as "pixel removal regions." Each pixel removal region may still have pixels, albeit with a lower density of subpixels. Removing display pixels (e.g., removing transistors and/or capacitors associated with one or more sub-pixels) in the pixel free regions can drastically help increase transmission and improve the performance of the under-display sensor 13. The pixel removal regions may therefore have a first subpixel density, whereas the rest of the display (often referred to collectively as the active area) may exhibit a second ("native") subpixel density that is greater than the first subpixel density. The native subpixel density of the active area may be at least two times, three times, four times, 1-5 times, or 1-10 times the subpixel density of the pixel removal regions.

Figure 4A:
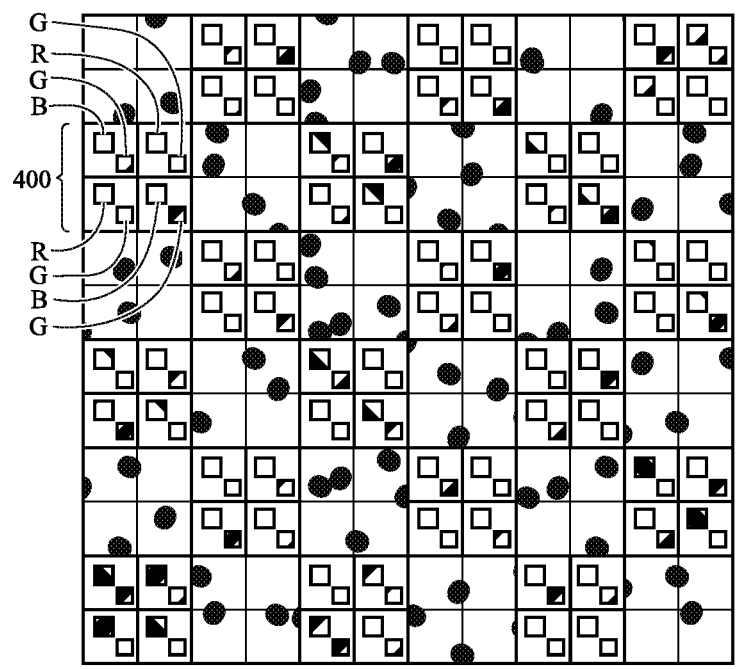
FIGS. 4A-4D are top views showing various pixel removal schemes for improving optical transmission in accordance with some embodiments.

FIGS. 4A-4D are top views showing various pixel removal regions for improving optical transmission in accordance with some embodiments. As an example, display 14 may generally include a repeating pixel group 400 that includes red (R) subpixels, green (G) subpixels, and blue (B) subpixels. As shown in FIG. 4A, each pixel group 400 may include two rows of colored subpixels, where the top row includes BGRG subpixels in that order and where the bottom row includes RGBG subpixels in that order. This particular pattern is merely illustrative and is not intended to limit the scope of the present embodiments. If desired, other color display patterns may be implemented in display 14, which can include subpixels of other colors (e.g., cyan subpixels, magenta subpixels, yellow subpixels, clear subpixels, etc.).

In the example of FIG. 4A, every other pixel group 400 has been removed in accordance with a checkerboard pattern. The stippled regions illustrate where subpixels would have existed if no removal scheme is implemented but is now at least partially devoid of thin-film transistor circuitry corresponding to the display subpixels that have been removed. Each individual stippled region may be referred to as a non-pixel region, pixel free regions or pixel lacking region. This type of pixel removal scheme may remove up to 50% of all available display subpixels.

Figure 4B:
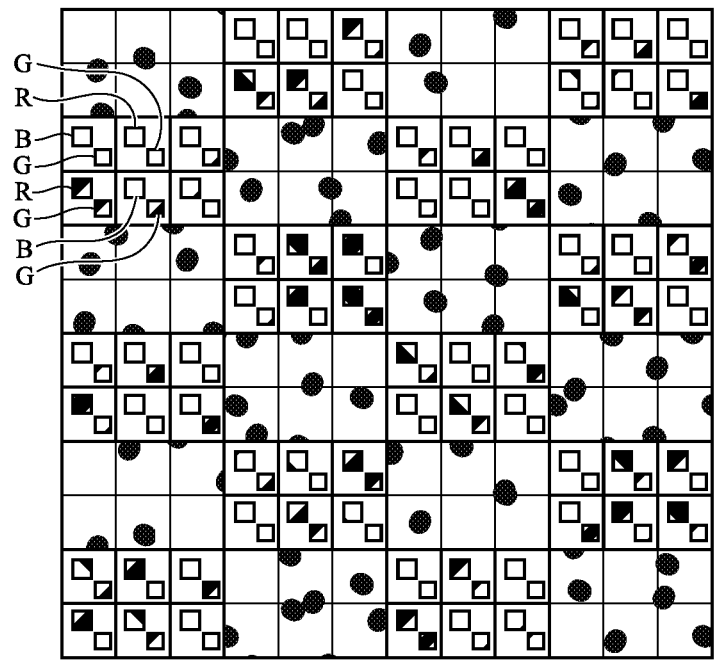
Figure 4C:
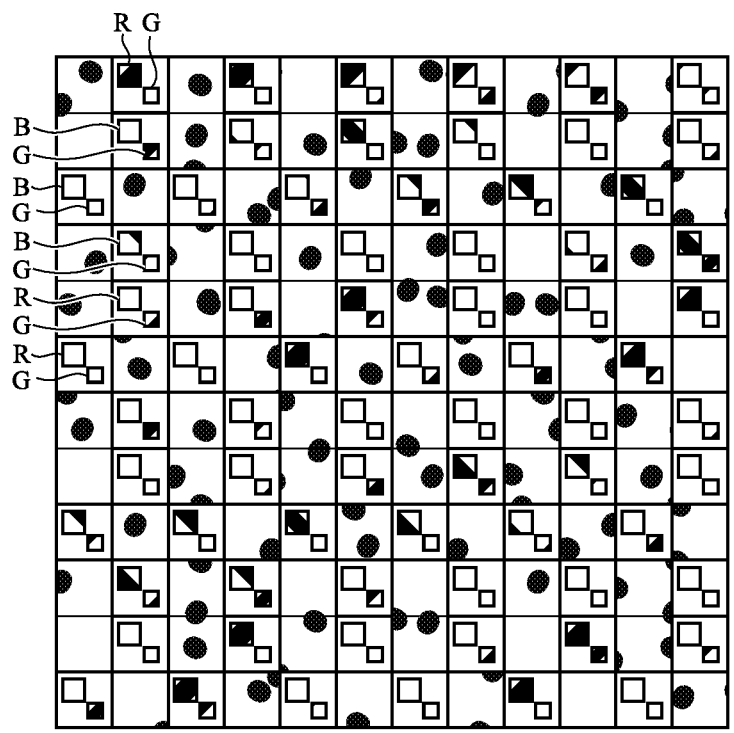
Figure 4D:
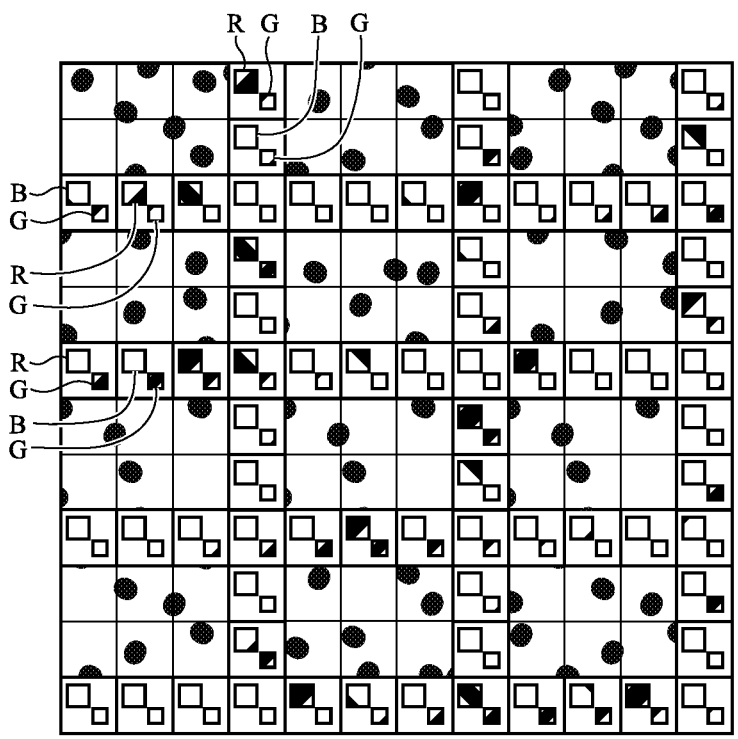

In FIG. 4A, each non-pixel region represents eight removed sub-pixels. FIG. 4B illustrates another pixel removal scheme in which each stippled non-pixel region represents 12 removed subpixels in another checkerboard-like pattern. This type of pixel removal scheme may also remove up to 50% of all available display subpixels. FIG. 4C illustrates yet another pixel removal scheme in which some stippled pixel free regions represent four removed subpixels while other stippled pixel-free regions represent only two removed subpixels in a repeating mosaic-like pattern. This type of pixel removal scheme may also remove up to 50% of all available display subpixels. FIG. 4D illustrates yet another pixel removal scheme in each stippled pixel lacking region represents twelve removed subpixels while removing more than 50% of all available display subpixels from the pixel removal region overall.

In general, the amount of pixel removal in the pixel removal region should be carefully chosen so as to maximize optical transmittance through the display stack while ensuring that the effective pixels per inch (PPI) is still sufficiently high such that the user of device 10 will not be able to visually notice any undesired display artifacts in the vicinity of the pixel removal region over which sensor(s) 13 may be located. The exemplary pixel removal regions of FIGS. 4A-4D are merely illustrative. If desired, other pixel removal arrangements in which up to 10% of display subpixels have been removed in the pixel removal region, up to 20% of display subpixels have been removed, up to 30% of display subpixels have been removed, up to 40% of display subpixels have been removed, up to 50% of display subpixels have been removed (i.e., the subpixel density of the pixel removal region may be half of the subpixel density of the native active area), 0-50% of display subpixels have been removed, 10-50% of display subpixels have been removed, 20-50% of display subpixels have been removed, 30-50% of display subpixels have been removed, 51-90% of display subpixels have been removed, or more than 50% of display subpixels have been removed (i.e., the subpixel density of the pixel removal region may be less than half of the subpixel density of the native active area) may be implemented to achieve the desired level of optical transmittance through the display stack.

Figure 5A:
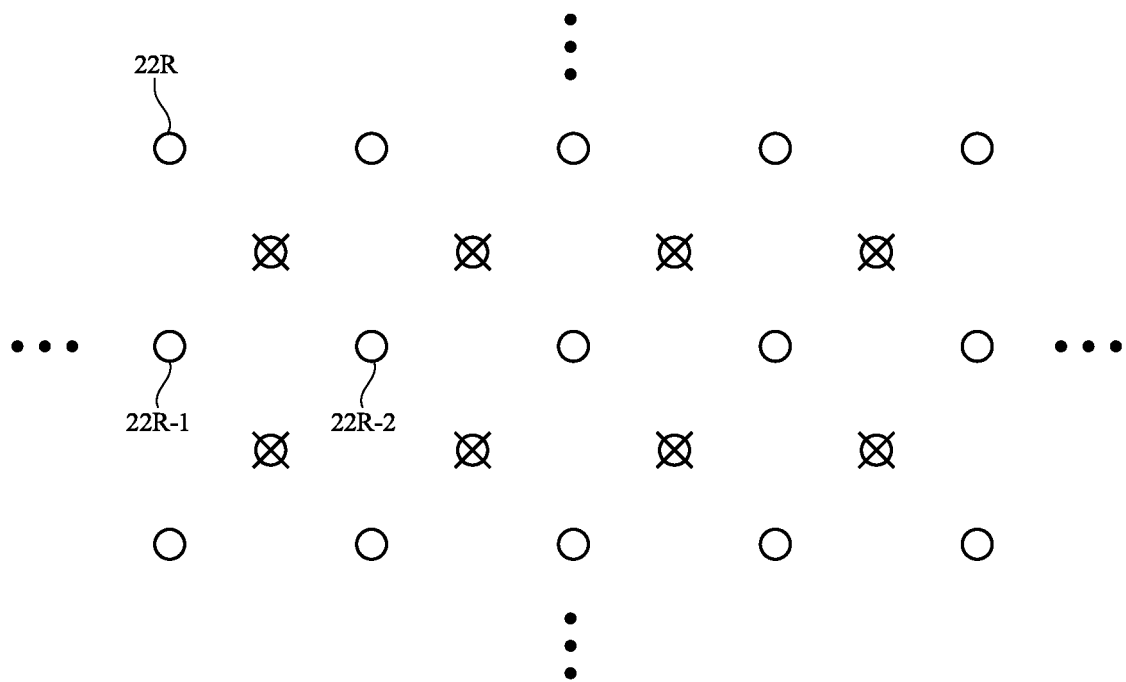
FIG. 5A is a top layout view showing how red subpixels can be systematically removed in accordance with an embodiment.

The illustrative pixel removal schemes shown in the embodiments of FIGS. 4A-4D may not be capable of providing a uniform distribution of subpixels in all directions across the surface of display 14. To provide a uniform distribution of subpixels across the display surface, an intelligent pixel removal process may be implemented that systematically eliminates the closest subpixel of the same color (e.g., the nearest neighbor of the same color may be removed). FIG. 5A is a top layout view showing how red subpixels can be systematically removed in accordance with an embodiment. The blue and green subpixels are omitted from FIG. 5A to help avoid obscuring the present embodiments.

As shown in FIG. 5A, display 14 may be initially provided with an array of red subpixels 22R. The pixel removal process may involve selecting a given subpixel, identifying the closest or nearest neighboring subpixels (in terms of distance from the selected subpixel), and then eliminating/omitting those identified subpixels in the final pixel removal region. For instance, subpixel 22R-1 may represent a first selected subpixel. The two closest subpixels may then be marked for elimination (as indicated by markup "X"). Subpixel 22R-2 may represent a second selected subpixel. The four closest subpixels (which includes the two previously marked subpixels) may be marked for elimination. This pixel removal process may be performed across the entire display pixel array for subpixels of all colors.

Figure 5B:
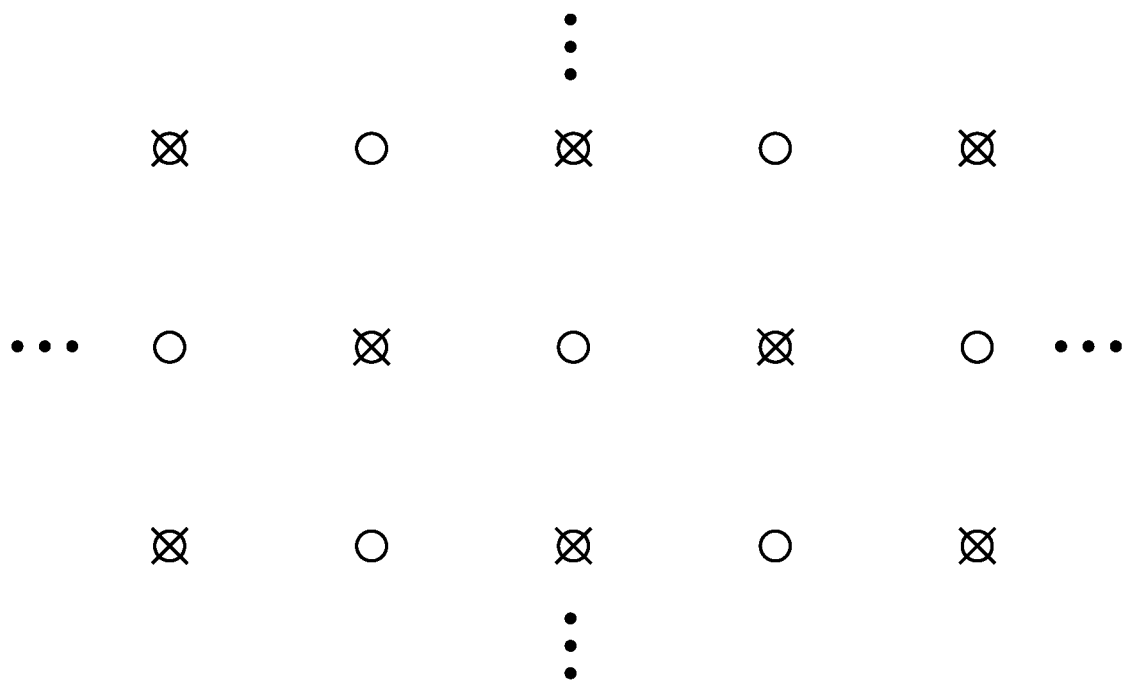
FIG. 5B is a top layout view showing how additional red subpixels can be further systematically removed from the arrangement of FIG. 5A in accordance with an embodiment.

FIG. 5A illustrates the resulting subpixel array after one iteration of pixel removal has been performed. If desired, additional iterations of subpixel removal may be performed to further increase transmittance at the expense of lower pixel density. FIG. 5B illustrates the resulting subpixel array after another iteration of pixel removal has been performed (e.g., a second order result by again eliminating the closest neighboring subpixels). If desired, any suitable number of iterations may be carried out. Systematically removing subpixels in this way can provide uniform color balance while maintaining a high PPI.

Figure 6A:
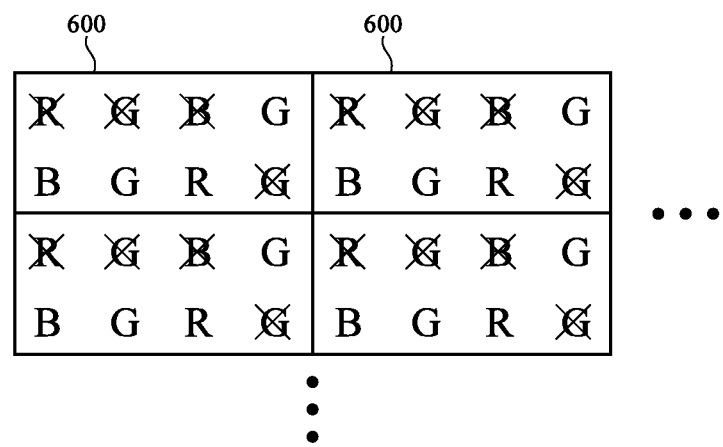
FIGS. 6A and 6B are diagrams showing an illustrative pixel removal scheme that follows the process illustrated in FIG. 5A in accordance with an embodiment.
Figure 6B:
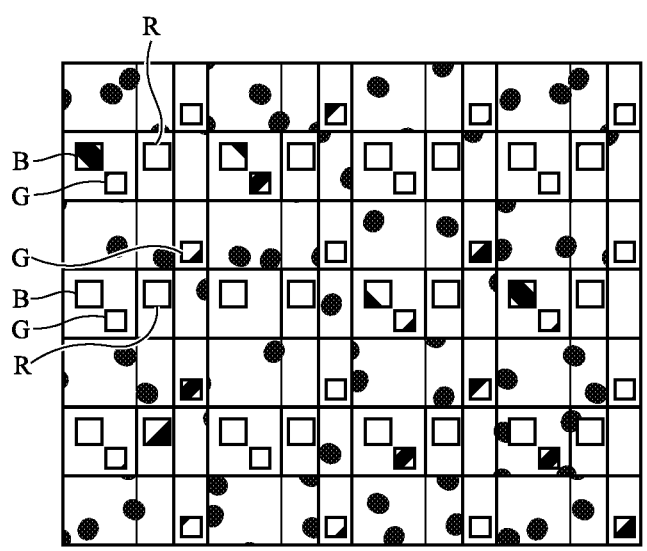

FIG. 6A shows how subpixels of various colors may be removed using a process of the type described in connection with FIG. 5A. As shown in FIG. 6A, each pixel group 600 may include two rows of colored subpixels, where the top row includes RGBG subpixels in that order and where the bottom row includes BGRG subpixels in that order. In particular, the red, green, and first green subpixels may be removed from the first row, whereas only the second green subpixel is removed from the second row in each pixel group 600. The resulting arrangement of the pixel removal region implemented using this method is illustrated in FIG. 6B. As shown in FIG. 6B, some of the stippled pixel lacking regions represent three consecutive removed subpixels while other pixel lacking regions represent only one removed subpixel. This type of pixel removal scheme may also remove 50% of all available display subpixels in the pixel removal region (e.g., the pixel density of the pixel removal region may be half of the native pixel density of the active area).

Figure 6C:
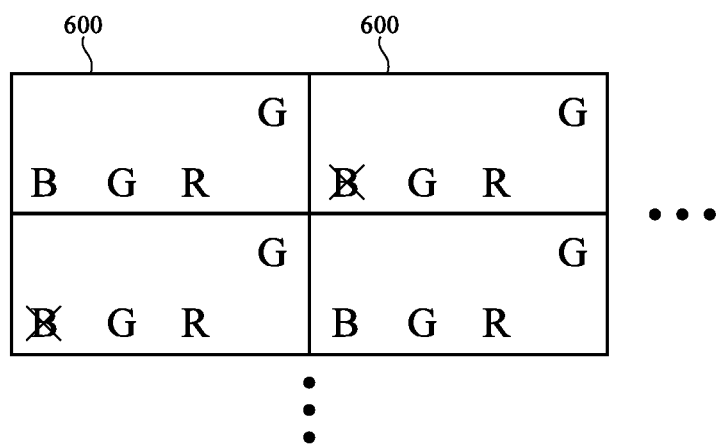
FIG. 6C is a diagram illustrating non-uniform subpixel omission in accordance with an embodiment.

FIG. 6C illustrates another suitable arrangement where additional blue subpixels are removed from the configuration of FIG. 6A. As shown in FIG. 6C, every other pixel group 600 will have all of the blue subpixels removed. In other words, more blue sub-pixels may be removed or omitted relative to the green or red subpixels (i.e., the density of the blue subpixels is lower than the density of the red subpixels in the pixel removal region). This example where the non-uniform subpixel removal/omission is targeted towards blue subpixels is merely illustrative and is not intended to limit the present embodiments. If desired, more green subpixels may be omitted relative to the blue/red subpixels, more red subpixels may be omitted relative to the blue/green subpixels, or other non-uniform subpixel removal scheme may be implemented. In yet other suitable embodiments, the degree of omission of all the different colored subpixels may be different, which will affect the density of each subpixel. As an example, more blue subpixels may be removed than the green subpixels, and more green subpixels may be removed than the red subpixels (i.e., the blue subpixels have the highest removal rate and thus the lowest subpixel density, whereas the red subpixels have the lowest removal rate). As another example, more blue subpixels may be removed than the red subpixels, and more red subpixels may be removed than the green subpixels (i.e., the blue subpixels have the highest removal rate, whereas the green subpixels have the lowest removal rate and thus the highest subpixel density). As yet another example, more green subpixels may be removed than the blue subpixels, and more blue subpixels may be removed than the red subpixels (i.e., the green subpixels have the highest omission rate, whereas the red subpixels have the lowest omission rate). Other permutations may also be implemented.

Figure 6D:
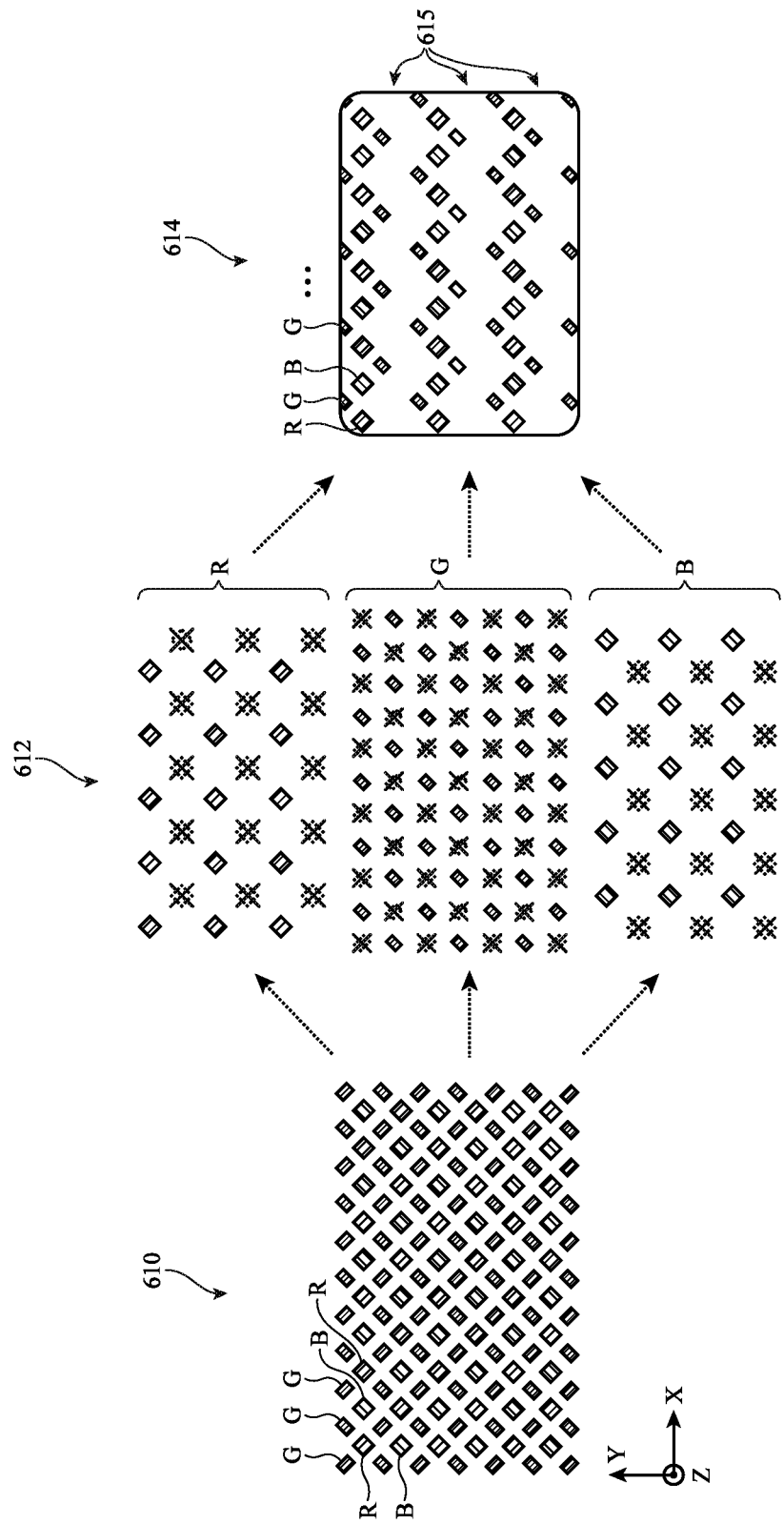
FIG. 6D is a diagram showing another illustrative pixel removal scheme in accordance with an embodiment.

The example of FIG. 6B where each individual subpixel is illustrated as a rectangular region have edges parallel to the display edge is merely illustrative. If desired, each subpixel region may have edges that are angled or rotated relative to the display edge (see, e.g., FIG. 6D). In FIG. 6D, the display edge may be parallel to the X axis or the Y axis. The front face of the display may be parallel to the XY plane such that a user of the device views the front face of the display in the Z direction. Portion 610 of FIG. 6D shows the native subpixel arrangement prior to removal. Portion 612 illustrates how every other subpixel may be removed for each color—the removed subpixels are marked using "X"). Portion 614 shows the resulting pixel configuration with 50% of the subpixels removed.

Figure 6E:
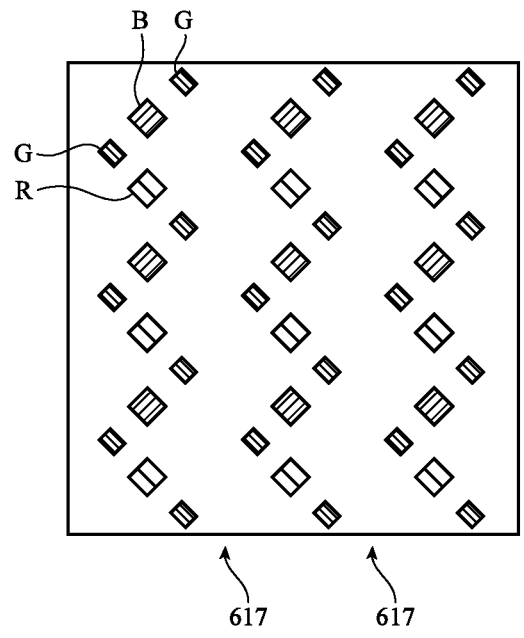
FIG. 6E is a diagram showing a vertical pixel removal scheme in accordance with an embodiment.

In the example of FIG. 6D, the subpixels are removed such that there are horizontal stripes of empty pixel regions (see, e.g., continuous striping regions 615 devoid of subpixels in portion 614). This is merely illustrative. If desired, the subpixels may also be removed to create vertical stripes of empty pixel regions (see, e.g., FIG. 6E having contiguous striping regions 617 devoid of subpixels).

Figure 6F:
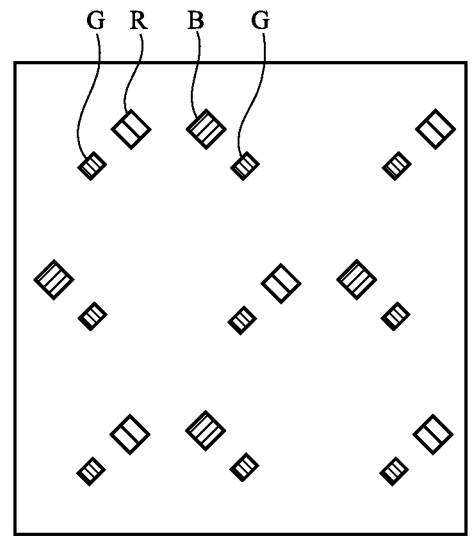
FIG. 6F is a diagram of a pixel arrangement after two pixel removal iterations in accordance with an embodiment.

As described above in connection with FIG. 5B, multiple iterations of pixel removal may be performed. FIG. 6F is a diagram of a pixel arrangement after two pixel removal iterations. Compared to the configuration in portion 614 of FIG. 6D, the configuration of FIG. 6F has an even smaller subpixel density (e.g., by again eliminating the closest neighboring subpixels, the second order result may have only half the number of subpixels compared to the first order result). In other words, after two pixel removal iterations, 75% of the original native subpixels may be removed. If desired, any suitable number of iterations may be implemented. Systematically removing subpixels in this way can provide uniform color balance while maintaining a high PPI.

Figure 6G:
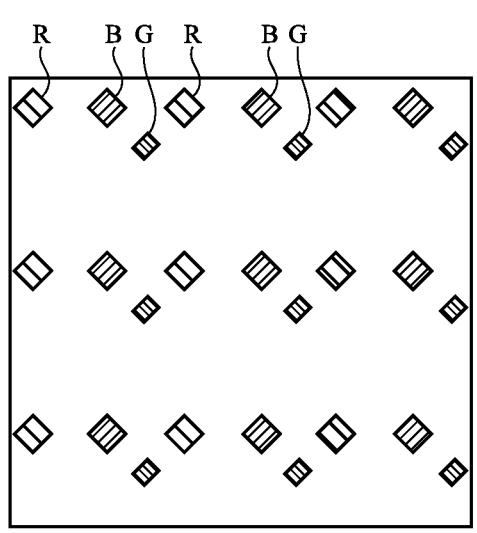
FIG. 6G is a diagram of a pixel arrangement where more green subpixels have been removed in accordance with an embodiment.

As described above in connection with FIG. 6C, non-uniform subpixel omission may be implemented. FIG. 6G is a diagram of a pixel arrangement where more green subpixels have been removed (e.g., a second round of removal may be performed only for the green subpixels). Compared to the configuration in portion 614 of FIG. 6D, the configuration of FIG. 6G has the same number of blue and red subpixels but has only half the number of green subpixels remaining. Since the native pixel group has two green subpixels for every red and blue subpixel pair, eliminating the nearest green neighbors twice may help balance the total number of green, red, and blue subpixels (e.g., the total number of remaining red, green, and blue subpixels may be the same). In other words, the density of the blue subpixels is equal to the density of the blue subpixels and is equal to the density of the red subpixels in the pixel removal region. If desired, the remaining green subpixels may optionally be enlarged in size to help compensate for the reduction in number.

Figure 6H:
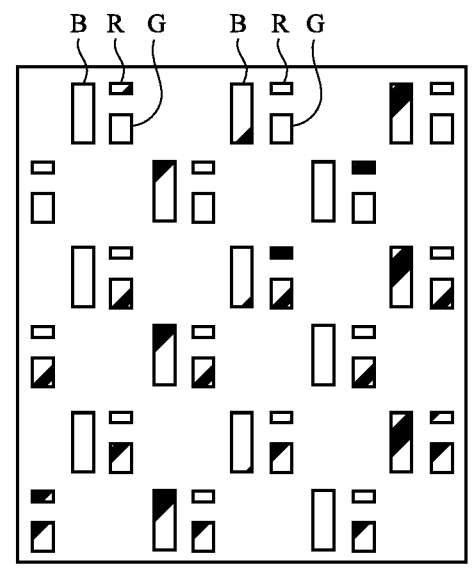
FIG. 6H is a diagram of a non-pentile pixel arrangement after pixel removal in accordance with an embodiment.

The native RGBG/BGRG subpixel arrangement illustrated in portion 610 of FIG. 6D may sometimes be referred to as having a "pentile" arrangement. If desired, the illustrative pixel removal schemes described herein may also be applied to non-pentile or straight pixel arrangements. FIG. 6H is a diagram of a non-pentile pixel arrangement after pixel removal. As shown in FIG. 6H, the number of remaining blue, red, and green subpixels are the same, but the blue region subpixel regions may be larger in size than the green subpixel regions, and the green subpixel regions may be larger in size than the red subpixel regions. This is merely illustrative. In general, the size of the different colored subpixel regions may be tuned for optimal display performance.

Figure 7A:
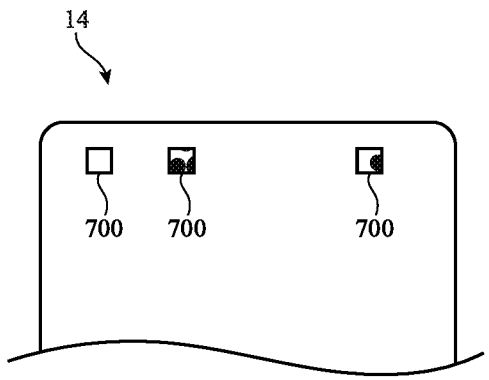
FIGS. 7A-7F are front views of an electronic device display showing how the display may have one or more localized regions in which the pixels are selectively removed using the scheme of FIGS. 4-6 in accordance with some embodiments.
Figure 7B:
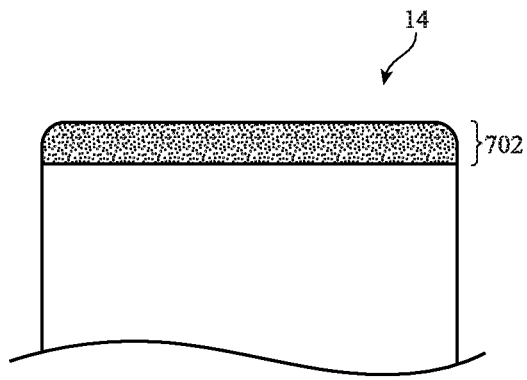
Figure 7C:
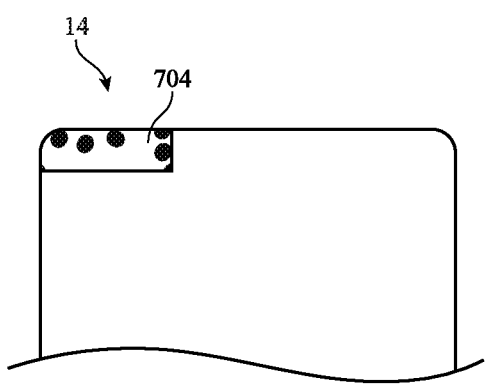
Figure 7D:
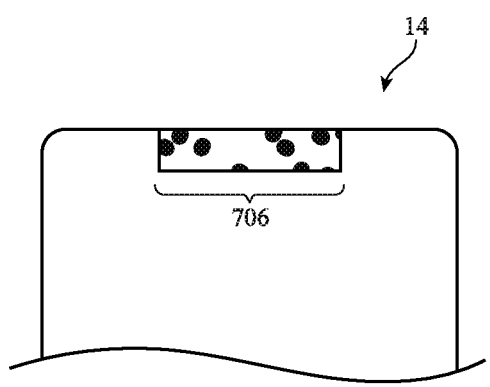
Figure 7E:
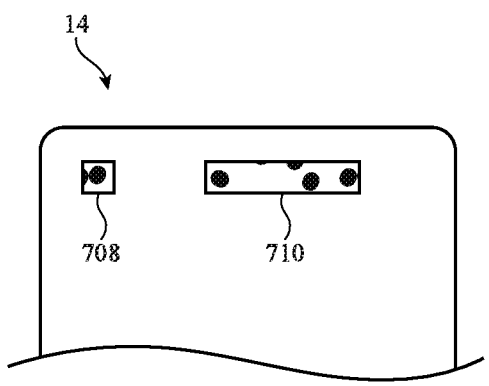
Figure 7F:
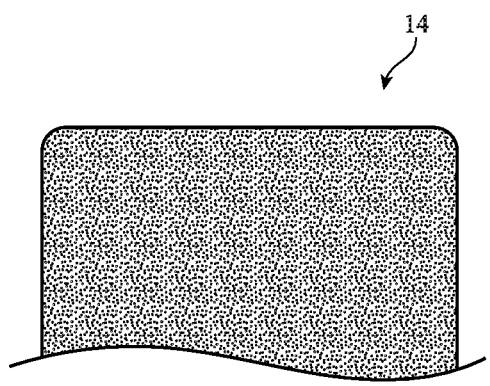

In general, the display subpixels may be partially removed from any region(s) of display 14. FIGS. 7A-7F are front views showing how display 14 may have one or more localized regions in which the pixels are selectively removed using the scheme of FIGS. 4-6 in accordance with certain embodiments. The example of FIG. 7A illustrates various local pixel removal regions 700 physically separated from one another (i.e., the various pixel removal regions 700 are non-continuous). The term "active area" may refer to regions of display 14 outside of and non-overlapping with the pixel removal regions. The various local areas 700 might for example correspond to three different sensors formed underneath display 14. The example of FIG. 7B illustrates a continuous pixel removal region 702 formed along the top border of display 14, which might be suitable when there are many optical sensors positioned near the top edge of device 10. The example of FIG. 7C illustrates a pixel removal region 704 formed at a corner of display 14. In some arrangements, the corner of display 14 in which pixel removal region 704 is located may be a rounded corner or a corner having a substantially 90° corner. The example of FIG. 7D illustrates a pixel removal region 706 formed only in the center portion along the top edge of device 10 (i.e., the pixel removal region covers a recessed notch area in the display). FIG. 7E illustrates another example in which pixel removal regions 708 and 710 can have different shapes and sizes. FIG. 7F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

Figure 7G:
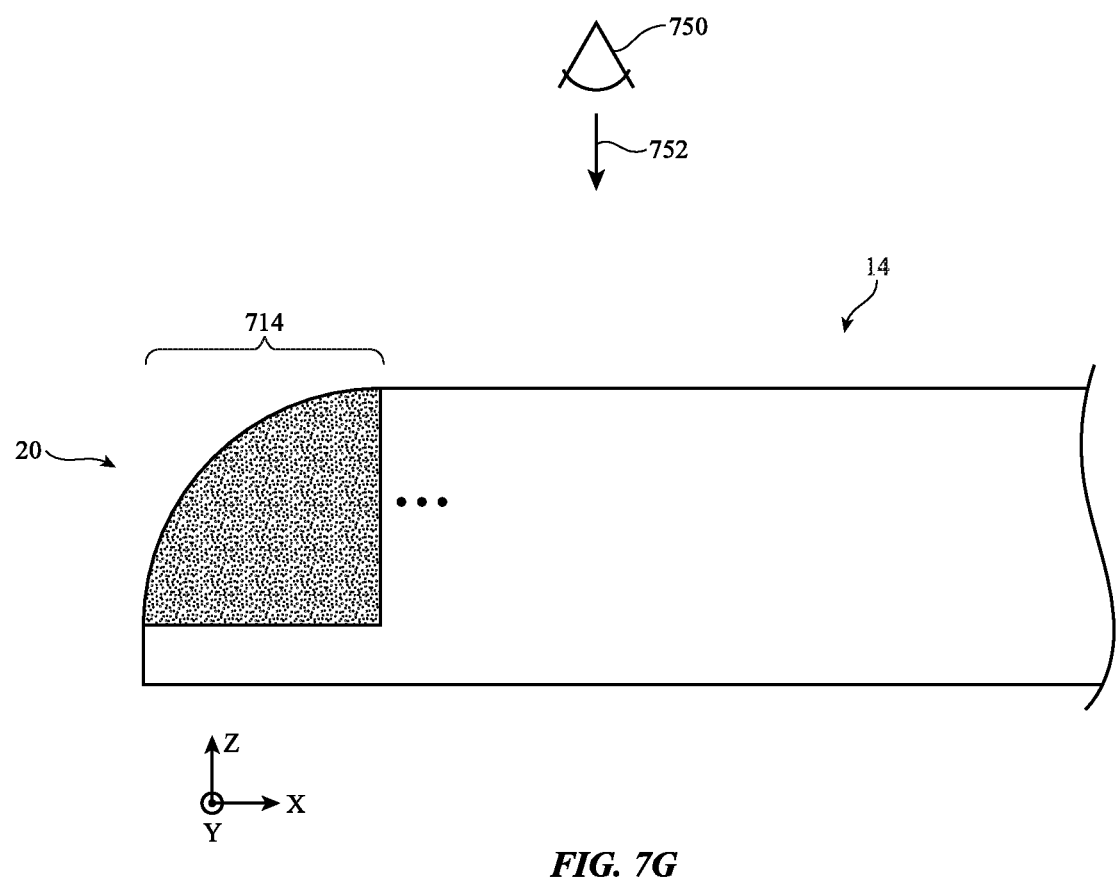
FIG. 7G is a cross-sectional side view of an electronic device display showing how the display may have one or more localized regions in which the pixels are selectively removed at a curved edge in accordance with an embodiment.

In yet another suitable arrangement, a pixel removal region may be formed at a curved edge portion of the display. FIG. 7G is a cross-sectional side view of display 14 showing a curved or bent peripheral edge region 20. A user 750 may view the front face of display 14 by looking in the direction of arrow 752 that is parallel to the Z direction. The front face of display 14 is parallel to the XY plane. As shown in FIG. 7G, a pixel removal region 714 may be formed in the bent edge portion 20. In general, one or more edges of the device may be curved or bent, and one or more pixel removal regions may optionally be formed in each curved edge portion.

Figure 8A:
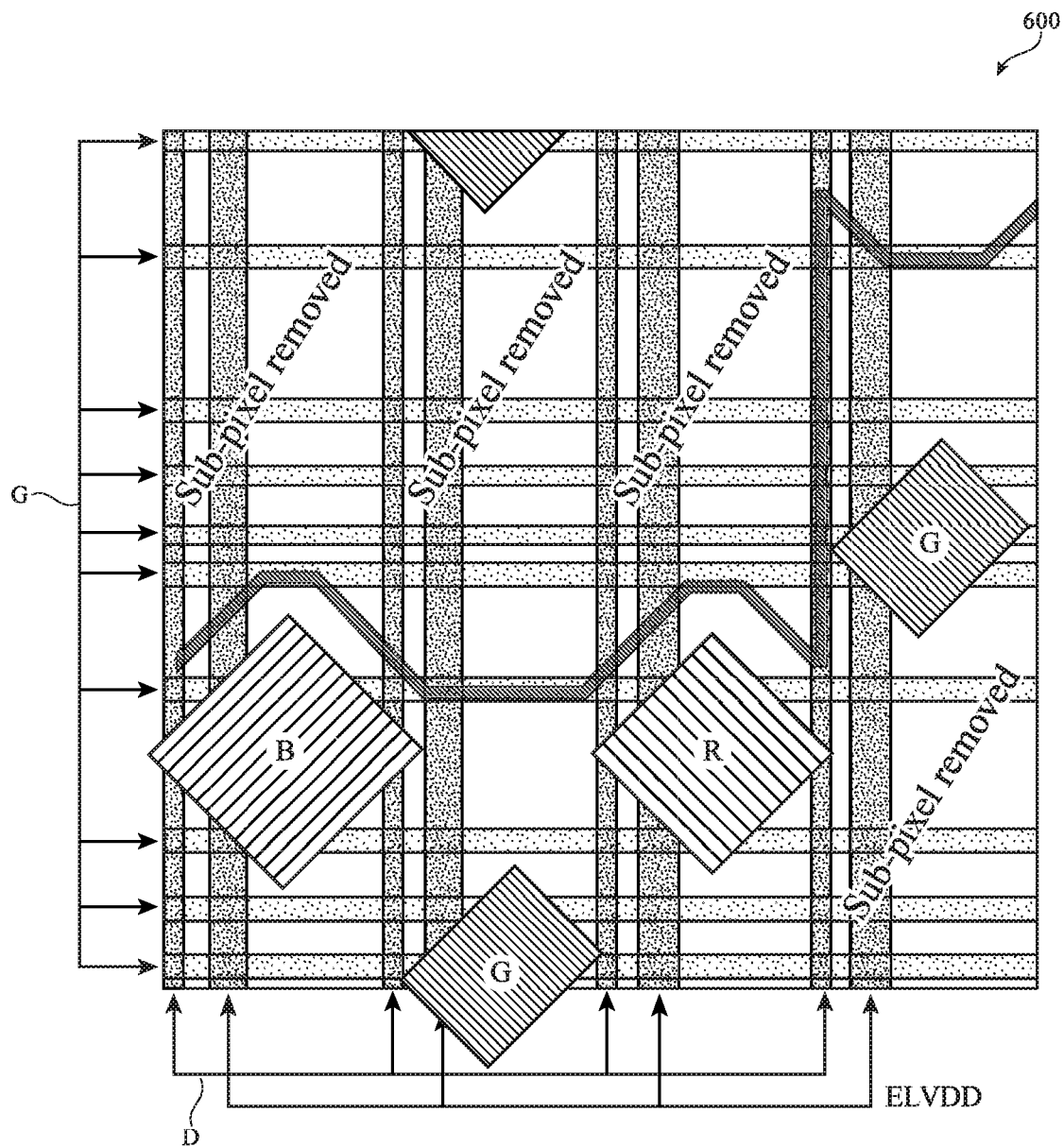
FIG. 8A is a top layout view showing how subpixel transistors may be selectively removed to increase transmittance in accordance with an embodiment.

FIG. 8A is a top layout view showing how some subpixels may be selectively removed from a pixel group 600 to increase transmittance in accordance with the pixel removal scheme shown in FIGS. 6A and 6B. The regions labeled "sub-pixel removed" correspond to pixel free regions that are completely devoid of thin-film transistors and capacitors that would otherwise be present had those subpixels not been removed. Removing the thin-film transistor structures, which might include active silicon or other semiconducting material, associated source-drain contacts, and also thin-film capacitor terminals, can help improve optical transmittance through the display stack in the pixel free regions.

As shown in FIG. 8A, the red, green, and blue subpixels have been removed from the upper portion of pixel group 600, whereas only the rightmost green subpixel has been removed from the lower portion of pixel group 600. FIG. 8A also shows various gate (G) lines (e.g., horizontal or row control lines) and data (D) lines (e.g., vertical or column control lines) that are routed over the thin-film transistors associated each display subpixel. Moreover, power supply lines carrying power supply voltages ELVDD might also be routed in the vertical column-wise direction. If desired, the power supply lines may also or alternatively be routed in the horizontal direction or in a diagonal fashion across the surface of the display.

If desired, the pixel structure of FIG. 8A may optionally be rotated or angled relative to a display edge that is parallel to the X axis or the Y axis. As an example, the pixel arrangement of FIG. 8A may be rotated at a 45° angle relative to the X axis. If desired, the pixel structures may be rotated by other suitable angles (e.g., by 30°, by 60°, by 90°, by 1-89°, etc.).

Figure 8B:
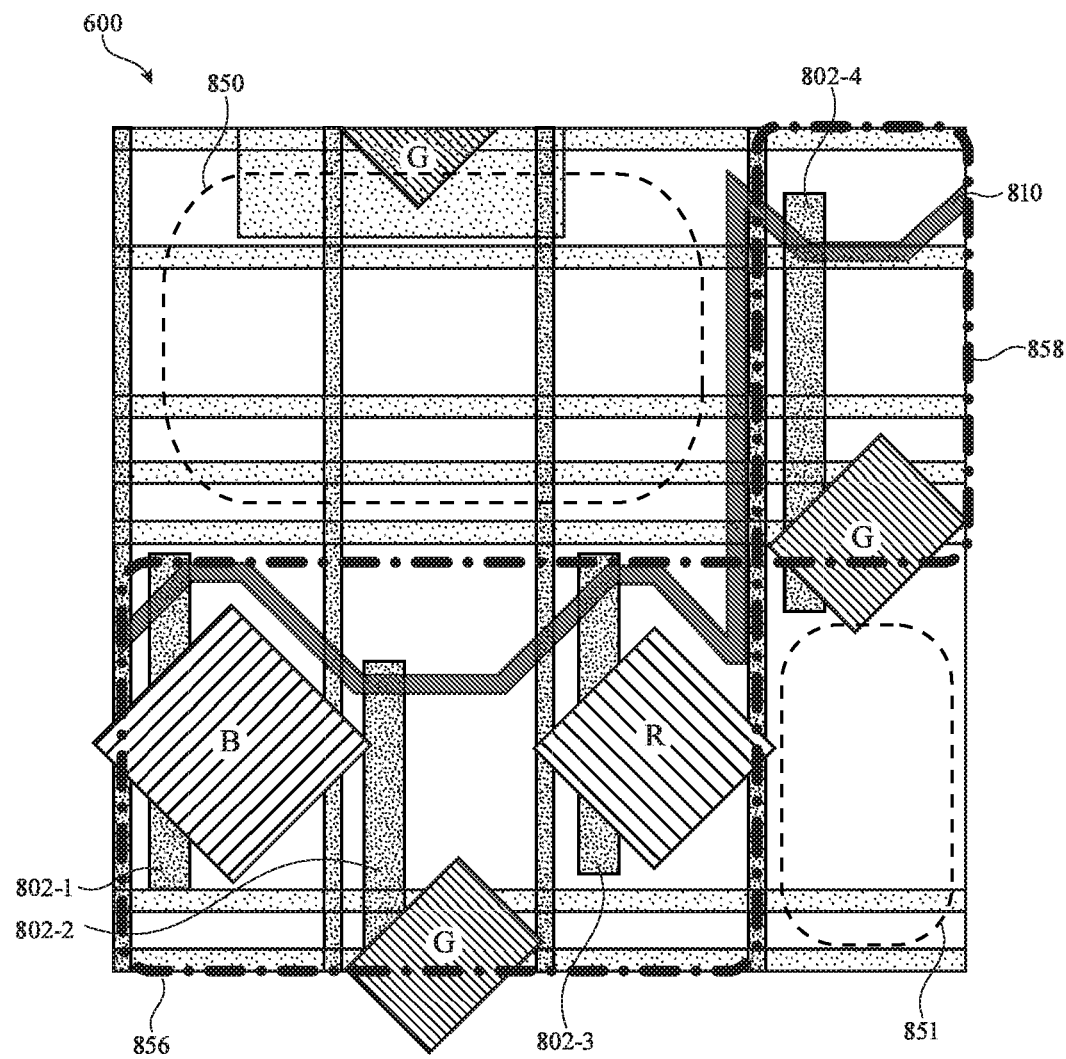
FIG. 8B is a top layout view showing how power lines over the removed transistors may also be omitted to further increase transmittance in accordance with an embodiment.
Figure 8C:
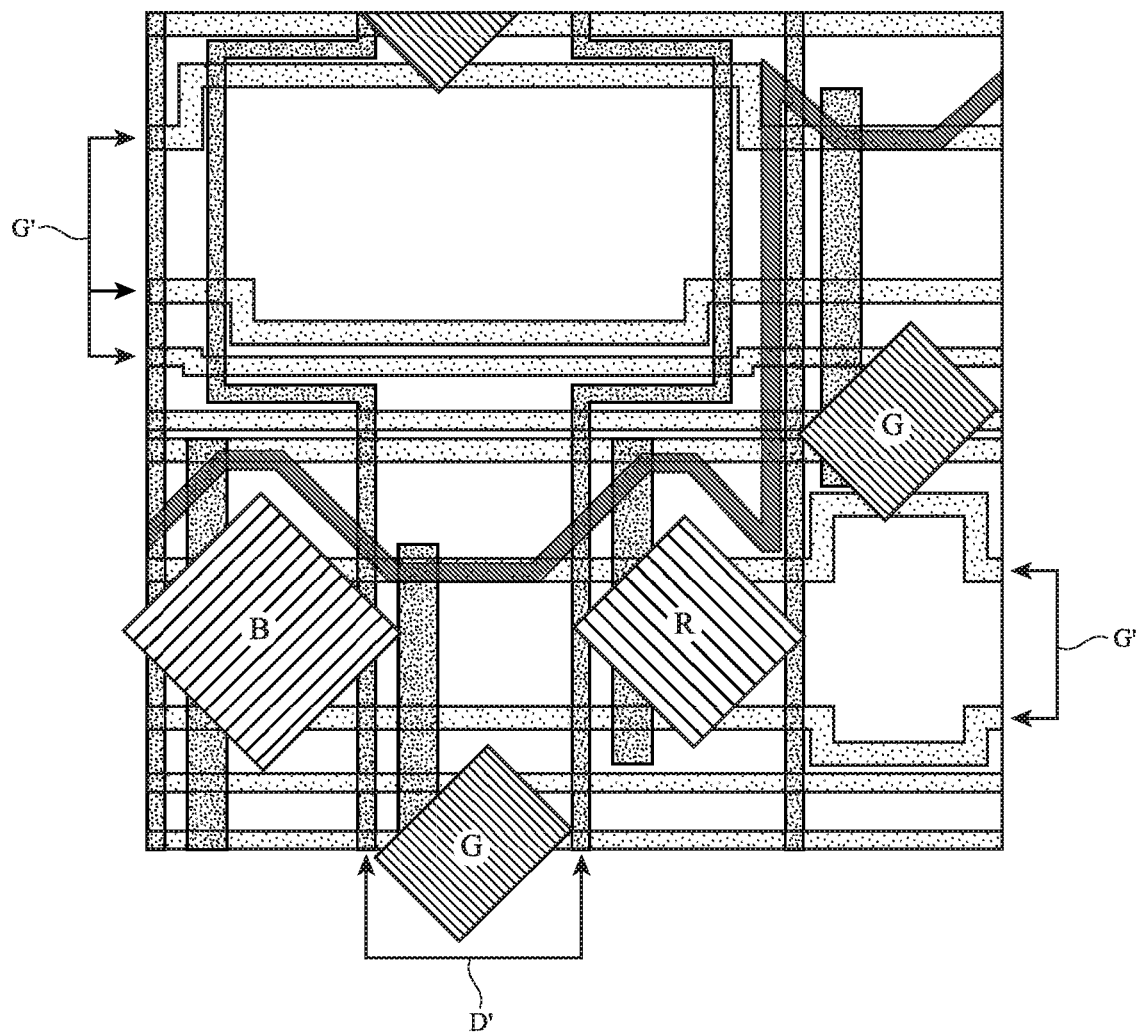
FIG. 8C is a top layout view showing how the horizontal and vertical routing lines may be rerouted to provide a larger continuous opening to reduce optical diffraction in accordance with an embodiment.

In the example of FIG. 8A, the power supply lines (see, e.g., the wider vertical routing traces) are still routed over the non-pixel regions, which contributes to the reduction in overall optical transmittance. In accordance with another suitable arrangement illustrated in FIG. 8B, the power supply lines may be selectively removed or omitted from the pixel free regions such as regions 850 and 851 (e.g., from each region where subpixels should be removed). As shown in FIG. 8B, the wider ELVDD routing traces are absent and no longer routed through non-pixel regions 850 and 851. Even though the ELVDD routing lines are shown as being broken into various segments in the vertical direction, the different power segments are still connected together using a conductive power mesh 810 formed in a higher routing layer than the ELVDD routing lines. Interconnecting the separate power line segments using power mesh 810 allows all of the remaining subpixels to be properly supplied with power. Selectively eliminating the power supply routing traces from the non-pixel areas can help further improve transmittance in the overall pixel removal region. In the example of FIG. 8B, there are still horizontal gate lines and vertical data lines that are routed over non-pixel regions 850 and 851, which may contribute to diffraction for light traveling through these regions. In certain embodiments, these conductive traces may be rerouted to provide a larger continuous opening in the non-pixel regions (see, e.g., FIG. 8C). As shown in FIG. 8C, gate lines G' and data lines D' may be routed in a more circuitous manner to achieve a larger open area. Routing the control signals in this way reduces diffraction albeit at the expense of decreased transmission.

In both FIGS. 8A and 8B, the diamond-shaped regions correspond to the OLEDs of each colored subpixel. In FIG. 8B, the thin-film transistors associated with the blue, green, and red subpixels may be formed in region 856 overlapping with the corresponding OLEDs, whereas the thin-film transistors associated with the green subpixel to the right may be formed in region 858. Since TFT regions 856 and 858 are not continuous with one another, the non-pixel regions 850 and 851 are also non-continuous with each other.

Figure 8D:
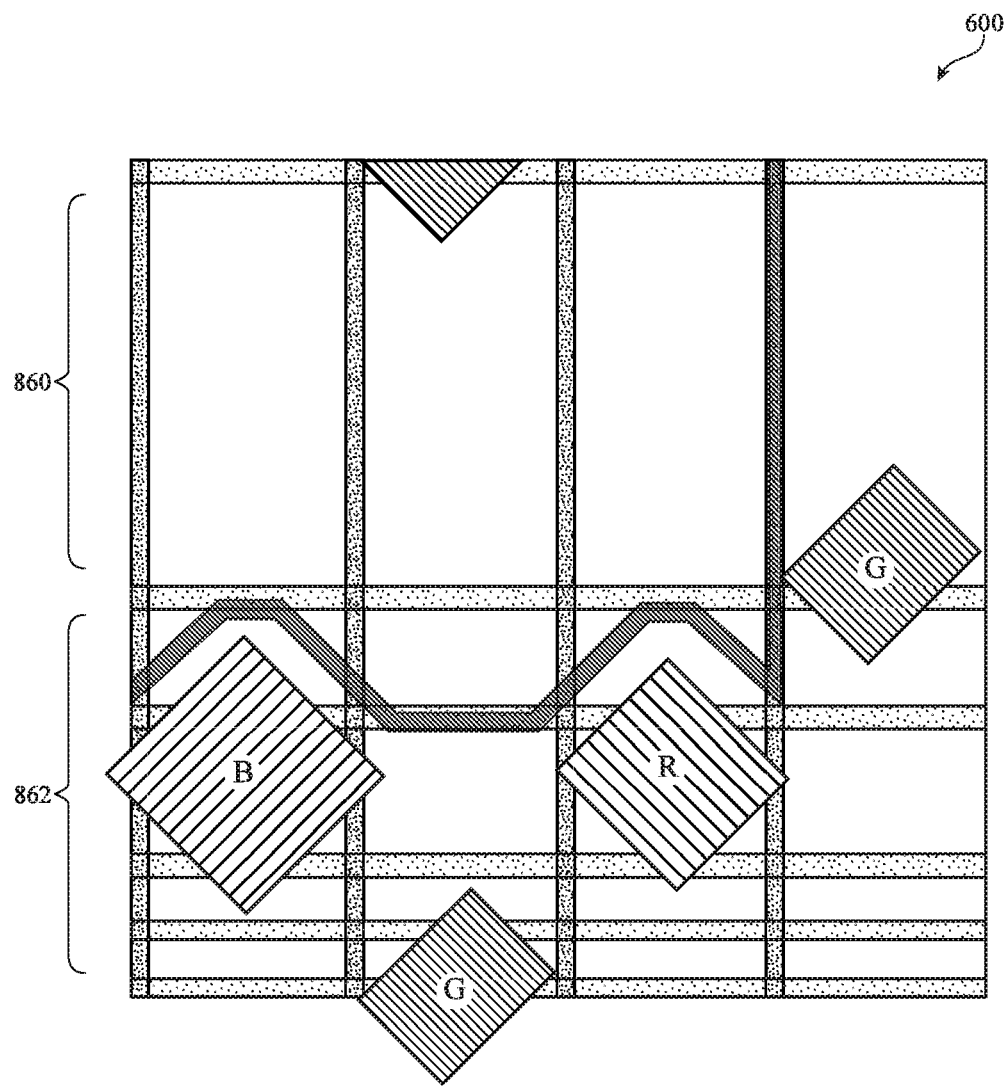
FIG. 8D is a top layout view showing how subpixel structures are relocated along a single row in accordance with an embodiment.

FIG. 8D illustrates another suitable arrangement in which the thin-film transistors associated with the lone green subpixel (i.e., the upper right green subpixel in pixel group 600) is shifted or relocated into region 851 such that the pixel group 600 can have a continuous pixel free region 860. The OLED of the green subpixel may remain unchanged. In other words, all the TFT structures are formed in row region 862, whereas row region 860 may be substantially devoid of TFT structures to help attain a larger continuous opening for improved transmittance.

Figure 8E:
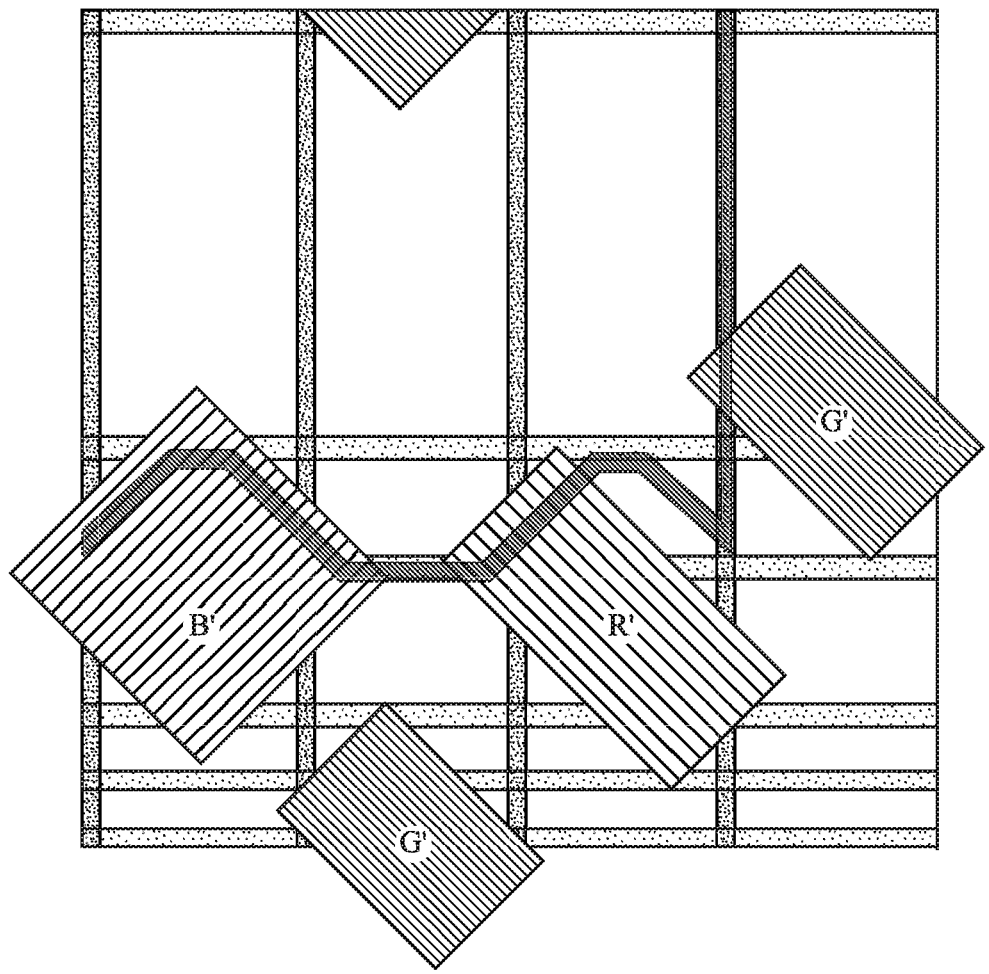
FIG. 8E is a top layout view showing how the size of subpixel structures may be enlarged in accordance with an embodiment.

The amount of current flowing through the drive transistor (e.g., transistor Tdrive in FIG. 2B) may be relatively high for remaining subpixels within a pixel removal region. To help mitigate potentially aging effects associated with the high drive current levels, the size of the remaining subpixels may be enlarged (e.g., the OLED and/or some of the associated transistors may be increased in size). In the example of FIG. 8E, the OLEDs of remaining blue subpixel B', green subpixels G', and red subpixel R' may be relatively larger than the OLEDs in other parts of the display with native subpixel density (i.e., relative to display pixels in the normal active area). Enlarging the OLEDs reduces current density, which can help prolong the lifetime of the diodes. If enlarging the pixel transistors, transistors such as the drive transistor may have its width increased and/or gate length decreased to help mitigate any potential accelerated aging effects due to the high drive current levels.

Figure 8F:
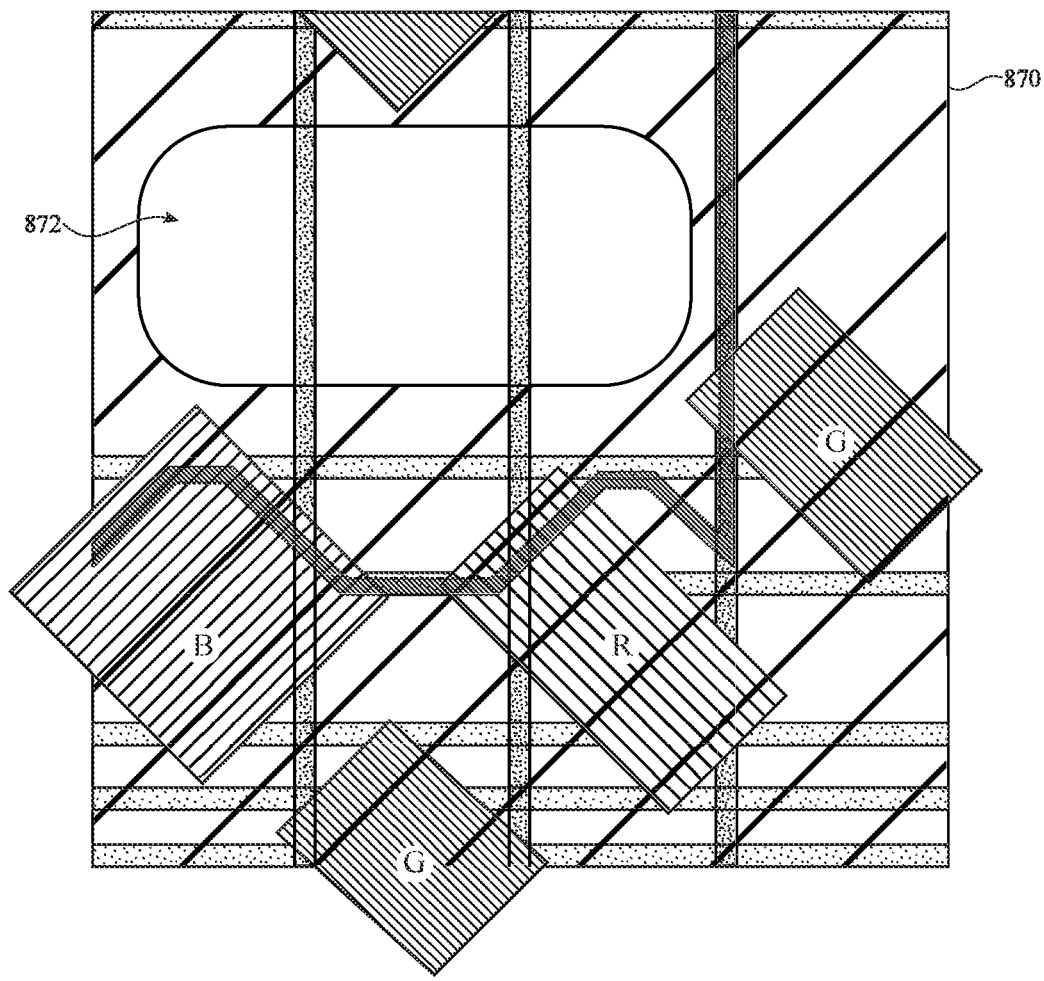
FIG. 8F is a top layout view showing how an opaque mask may be used to define an aperture opening in accordance with an embodiment.

FIG. 8F illustrates another suitable arrangement showing how an opaque mask such as mask 870 may be used to define an aperture opening. Mask 870 may be formed using existing metal routing layers, a pixel definition layer (e.g., a black pixel defining layer), and/or other suitable opaque layer. As shown in FIG. 8F, opaque mask 870 may have openings such as opening 872 aligned with a corresponding pixel free region (i.e., a continuous region where subpixels have been removed below). In general, opening 872 may have a predetermined shape (e.g., a rectangular window, a circular window, an oval window, an elliptical window, etc.) configured to help control the diffraction pattern for light traversing through the opening.

Figure 9A:
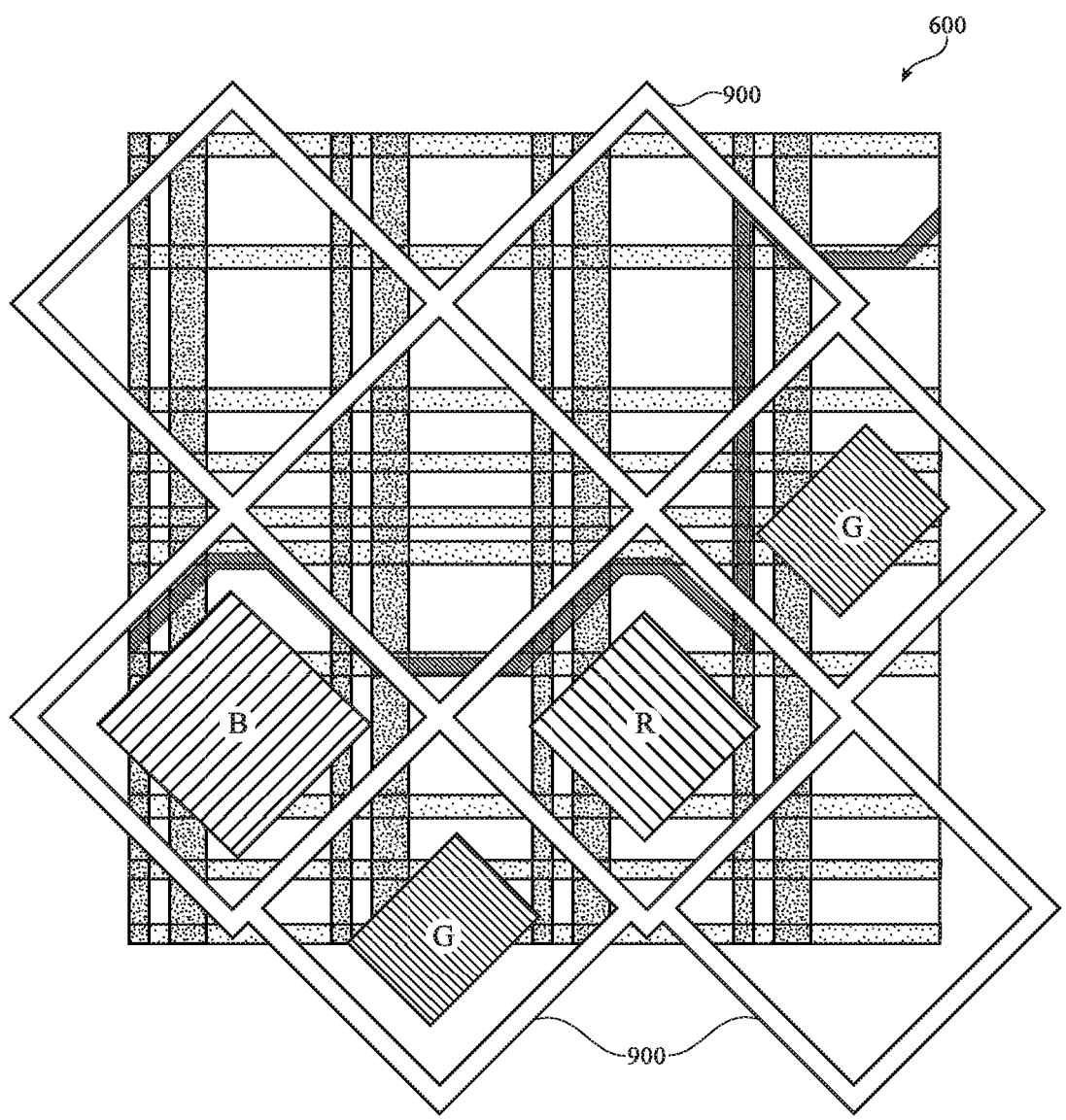
FIG. 9A is a top layout view showing illustrative touch conductive mesh circuitry formed over the pixel removal region in accordance with an embodiment.

In additional to the thin-film transistor structures, touch based circuitry such as touch-sensor traces within the touch layers 316 (FIG. 3) might also contribute substantially to the low transmission through the display stack. FIG. 9A is a top layout view showing illustrative touch conductive mesh circuitry 900 formed over the pixel removal region in accordance with an embodiment. As shown in FIG. 9A, none of the touch mesh 900 is removed (i.e., touch mesh 900 completely overlaps with the pixel removal region), so there is no reduction in touch functionality. On the other extreme, all of touch mesh 900 may be removed from the entire pixel removal region (i.e., the touch mesh and the pixel removal region are non-overlapping), which offers the highest optical transmission while sacrificing the loss of touch functionality in the pixel removal region. Completely removing mesh 900 might, however, result in a noticeable difference in contrast between the pixel removal region and the surrounding normal display region. For instance, the pixel removal region where touch mesh 900 is completely eliminated might appear more reflective than the surrounding regions, which may or may not be acceptable.

Figure 9B:
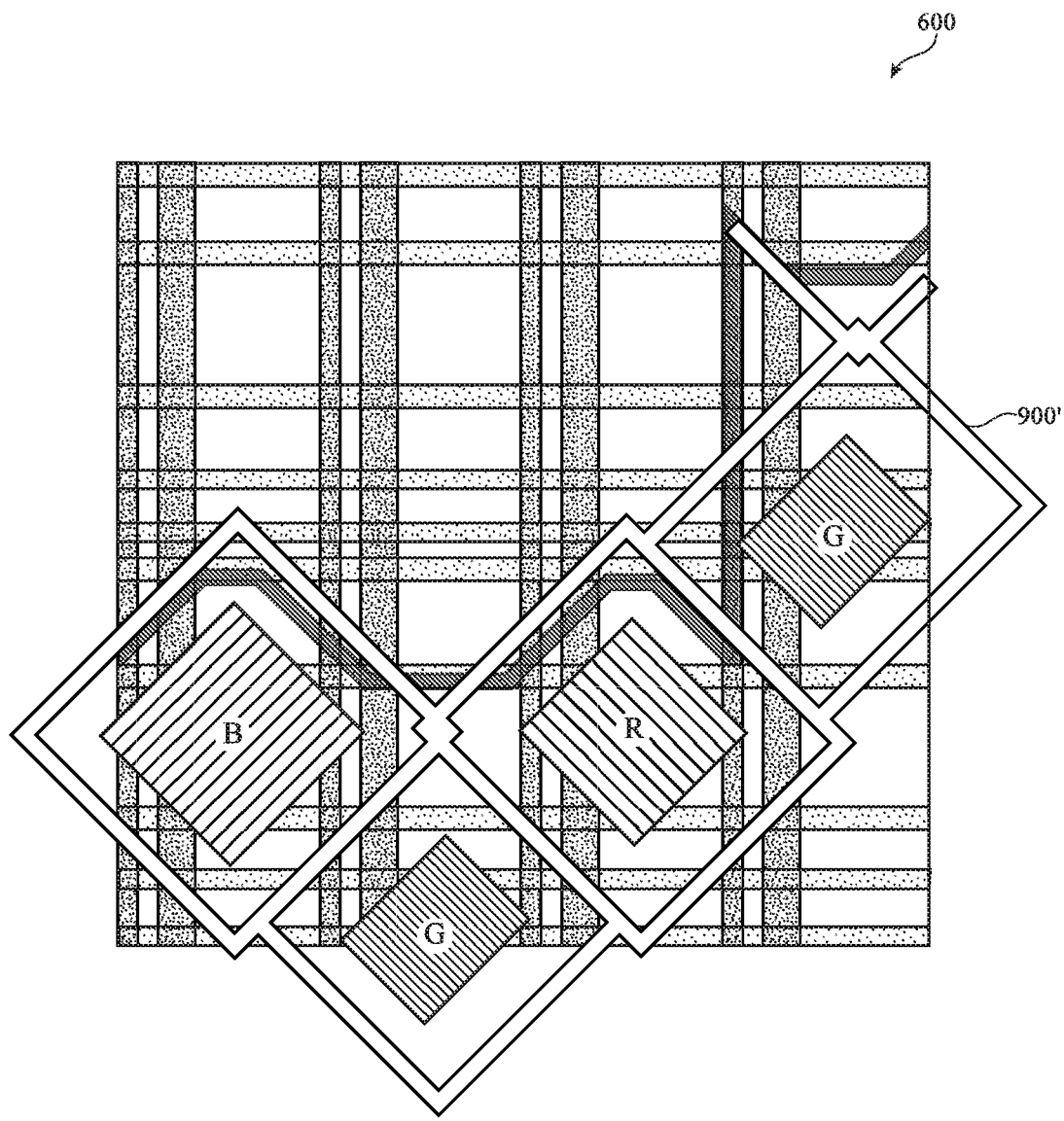
FIG. 9B is a top layout view showing how the touch conductive mesh circuitry may be partially removed over the pixel removal region in accordance with an embodiment.

FIG. 9B is a top layout view showing how touch conductive mesh circuitry 900' may be partially removed over the pixel removal region in accordance with another suitable arrangement. As shown in FIG. 9B, touch mesh 900' may be present over actual display subpixels but may be absent over the pixel free regions where the subpixels have been intelligently removed. This partial removal of the touch circuitry in the pixel removal region can provide improved optical transmittance while offering partial touch functionality and reduced contrast between the pixel removal region and the surrounding areas.

Figure 10A:
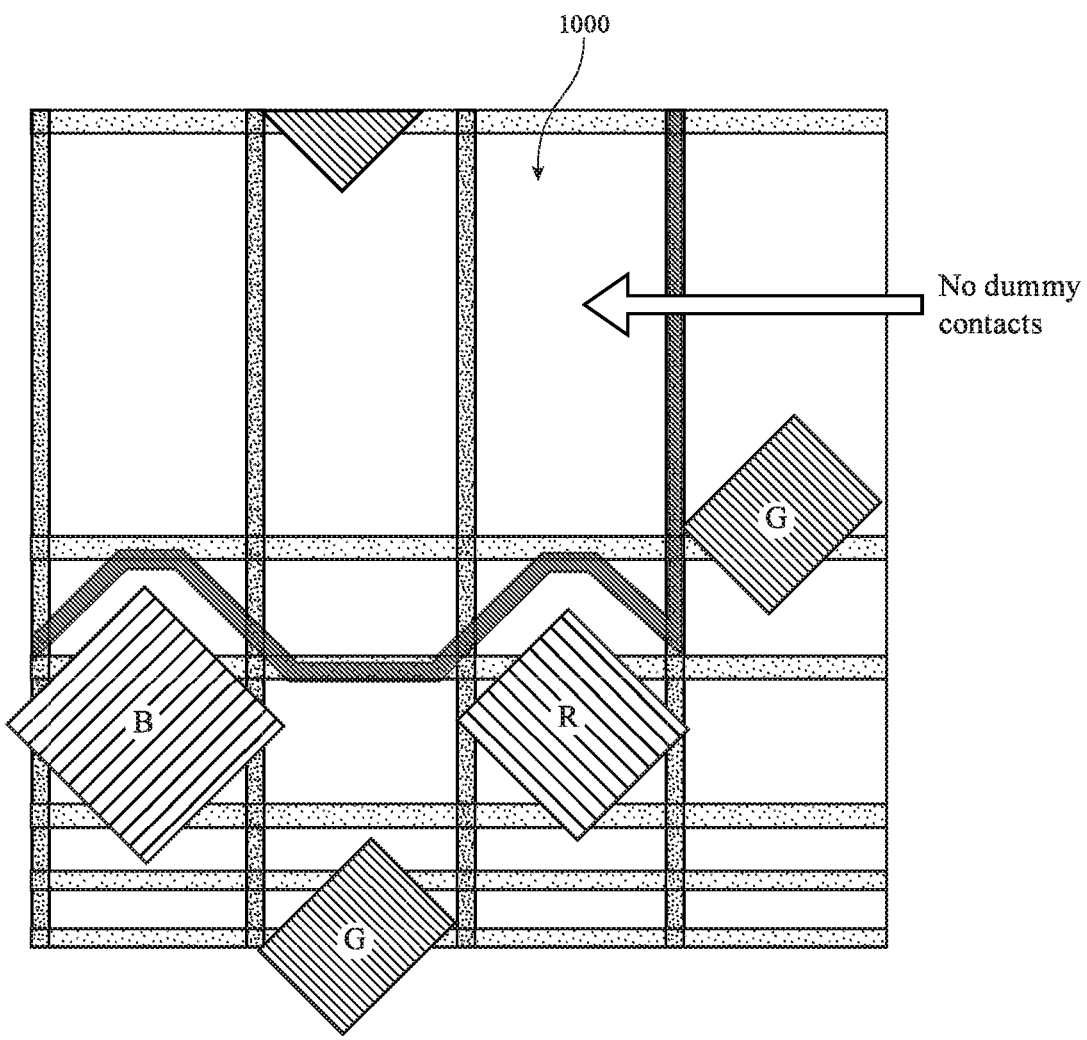
FIG. 10A is a top layout view showing how the region where the subpixel transistors have been removed lacks dummy contacts in accordance with an embodiment.

FIG. 10A is a top layout view showing how the pixel free region such as region 1000 where subpixel transistor structures have been removed lacks dummy contacts in accordance with an embodiment. A complete lack of dummy contacts in region 1000 helps maximize optical transmittance since the presence of dummy contacts can still block some amount of light. In accordance with another suitable arrangement, non-pixel region 1000 might actually include some dummy contacts even though the underlying transistor(s) have been removed. While the presence of dummy contacts slightly reduces transmittance, including dummy contacts (which may be formed from polysilicon material) helps to provide better polysilicon uniformity during manufacturing.

Figure 10B:
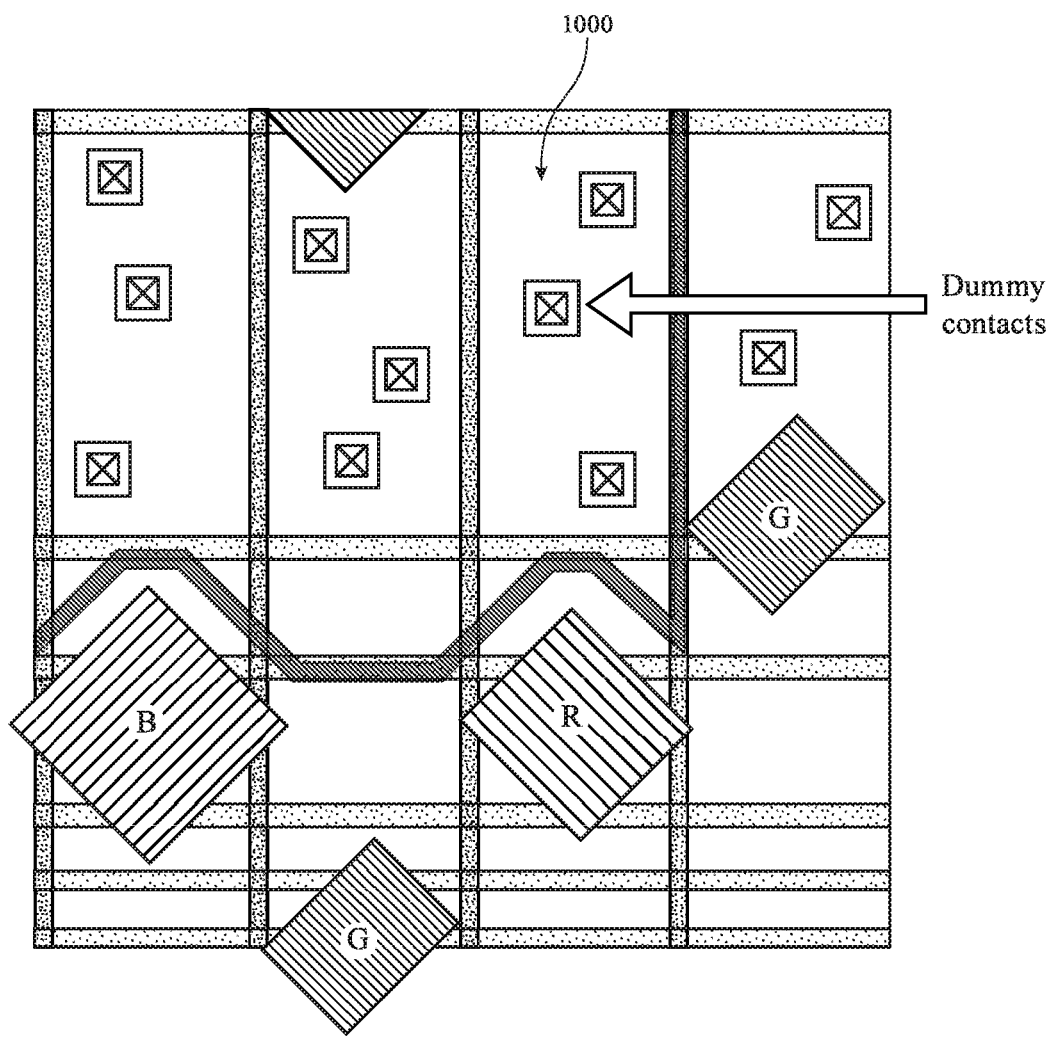
FIG. 10B is a top layout view showing how the region where the subpixel transistors have been removed includes dummy contacts in accordance with an embodiment.
Figure 10C:
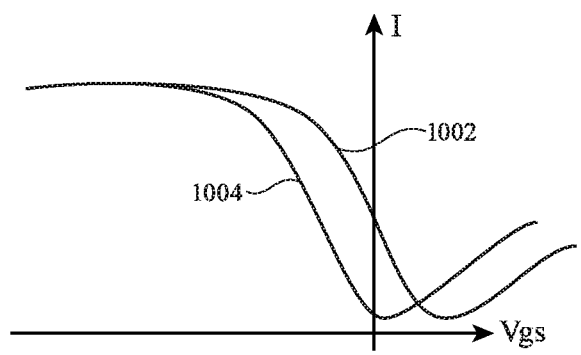
FIG. 10C is a plot of emission current versus gate-to-source voltage showing how the presence of dummy contacts can help improve the emission current profile in accordance with an embodiment.

Polysilicon uniformity may affect the transistor current profile, which is illustrated in FIG. 10C. FIG. 10C is a plot of emission current (I) versus gate-to-source voltage (Vgs). Curve 1002 may represent the current profile for active p-channel transistors adjacent to region 1000 in FIG. 10A, whereas curve 1004 may represent the current profile for active p-channel transistors adjacent to region 1000 in FIG. 10B. Curve 1004 offers a more ideal current behavior while curve 1002 offers a shifted version of the ideal profile. Thus, including dummy contacts in the pixel free regions can help maintain transistor current uniformity across the display.

Figure 11:
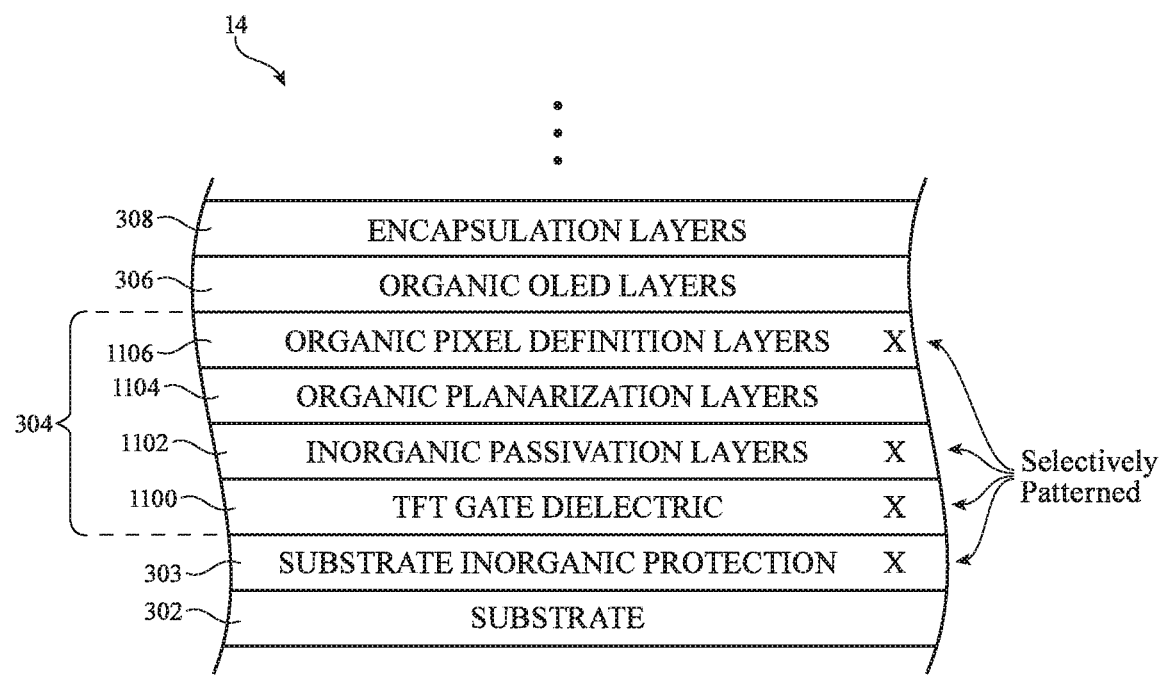
FIG. 11 is a cross-sectional side view of an illustrative display stack showing how at least some of the blanket layers within the display stack can be selectively patterned to improve optical transmittance in accordance with an embodiment.

FIG. 11 is a cross-sectional side view of an illustrative display stack showing how at least some of the blanket layers within the display stack can be selectively patterned to further improve optical transmittance. FIG. 11 is similar to the cross-section of FIG. 3, but expands upon the TFT layers 304. For example, FIG. 11 shows how TFT layers 304 may include a TFT gate dielectric layer 1100, inorganic passivation layers 1102 formed over the TFT gate dielectric layer 1100, one or more organic planarization layers 1104 formed over inorganic passivation layers 1102, and organic pixel definition layers 1106 formed over organic planarization layers 1104. Moreover, a protection layer such as substrate inorganic protection film 303 may be formed between substrate 302 and TFT layers 304. In certain embodiments, at least layers 303, 1100, 1102, and/or 1106 (which are typically blanket layers that cover the entire display surface) may be selectively patterned or thinned in the pixel removal region to further improve optical transmittance. If desired, other blanket display layers may also be selectively patterned/thinned to help increase the transmittance of light through the display stack.

In accordance with an embodiment, an electronic device is provided that includes a display having pixels formed in an active area and a sensor under the display, the display includes a pixel removal region that at least partially overlaps with the sensor, the active area has a first pixel density, and the pixel removal region has a second pixel density that is less than the first pixel density.

In accordance with another embodiment, the pixel removal region includes a plurality of pixel free regions each of which is devoid of thin-film transistors, and the plurality of pixel free regions is configured to increase signal transmittance through the display to the sensor.

In accordance with another embodiment, each of the plurality of pixel free regions is further devoid of power supply lines.

In accordance with another embodiment, horizontal and vertical control lines in the plurality of pixel free regions are rerouted to provide continuous open areas that reduce the amount of diffraction for light traveling through the display to the sensor.

In accordance with another embodiment, each of the plurality of pixel free regions include rows of continuous open areas within the pixel removal region.

In accordance with another embodiment, the electronic device includes an opaque mask with openings aligned to the plurality of pixel free regions.

In accordance with another embodiment, the second pixel density is half of the first pixel density.

In accordance with another embodiment, the second pixel density is less than half of the first pixel density.

In accordance with another embodiment, the display includes an additional pixel removal region that is physically separated from the pixel removal region.

In accordance with another embodiment, the additional pixel removal region has a different size than the pixel removal region.

In accordance with another embodiment, the pixel removal region overlaps an entire edge of the display.

In accordance with another embodiment, the pixel removal region overlaps a corner of the display.

In accordance with another embodiment, the pixel removal region overlaps a curved edge of the display.

In accordance with another embodiment, the pixel removal region overlaps a recessed notch area in the display.

In accordance with another embodiment, the pixel removal region overlaps the entire surface of the display.

In accordance with another embodiment, the pixel removal region includes first subpixels of a first color and second subpixels of a second color, and the density of the first subpixels is different than the density of the second subpixels in the pixel removal region.

In accordance with another embodiment, the pixel removal region includes blue subpixels and red subpixels, and the density of the blue subpixels is lower than the density of the red subpixels in the pixel removal region.

In accordance with another embodiment, the pixel removal region includes green subpixels, blue subpixels, and red subpixels, and the density of the blue subpixels is equal to the density of the blue subpixels and is equal to the density of the red subpixels in the pixel removal region.

In accordance with another embodiment, the pixels in the active area includes first subpixels, and the pixel removal region includes second subpixel having larger diodes than the first subpixels of the active area to mitigate aging.

In accordance with another embodiment, the electronic device includes a conductive touch sensor mesh formed over the display, the conductive touch sensor overlaps with the pixel removal region.

In accordance with another embodiment, the electronic device includes a conductive touch sensor mesh formed over the display, the conductive touch sensor mesh does not overlap with the pixel removal region.

In accordance with another embodiment, the pixel removal region includes a plurality of pixel free regions each of which lacks dummy contacts.

In accordance with another embodiment, the pixel removal region includes a plurality of pixel free regions each of which includes dummy contacts configured to provide emission current uniformity in the pixel removal region.

In accordance with another embodiment, the display includes a blanket layer that is selectively patterned in the pixel removal region to increase the transmittance of light through the display to the sensor, and the blanket layer is a display layer selected from the group consisting of: a substrate protection layer, a gate dielectric layer, an inorganic passivation layer, and an organic pixel definition layer.

In accordance with an embodiment, a display is provided that includes pixels formed in an active area and pixels formed in a given region within the active area, the pixels in the active area are formed at a first pixel density, and the pixels in the given region are formed at a second pixel density that is less than the first pixel density to increase the transmittance of light through the given region.

In accordance with an embodiment, an apparatus is provided that includes a display stack having a plurality of blanket display layers and an optical sensor at least partially covered by the display stack, at least some of the blanket display layers are patterned to increase light transmittance through the display stack to the optical sensor.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   a display having first pixels of a first pixel density formed in an active area, wherein the first pixels comprise diodes of a first size; and
   a sensor under the display, wherein the display comprises a sensing region that at least partially overlaps with the sensor, wherein the sensing region has second pixels of a second pixel density less than the first pixel density, and wherein the second pixels comprise diodes of a second size different than the first size.

2. The electronic device of claim 1, wherein the sensing region comprises a plurality of pixel free regions each of which is devoid of thin-film transistors, and wherein the plurality of pixel free regions is configured to increase signal transmittance through the display to the sensor.

3. The electronic device of claim 2, wherein each of the plurality of pixel free regions is further devoid of power supply lines.

4. The electronic device of claim 2, wherein horizontal and vertical control lines in the plurality of pixel free regions are rerouted to provide continuous open areas that reduce an amount of diffraction for light traveling through the display to the sensor.

5. The electronic device of claim 2, wherein each of the plurality of pixel free regions comprise rows of continuous open areas within the sensing region.

6. The electronic device of claim 2, further comprising:
   an opaque mask with openings aligned to the plurality of pixel free regions.

7. The electronic device of claim 1, wherein the second pixel density is half of the first pixel density.

8. The electronic device of claim 1, wherein the second pixel density is less than half of the first pixel density.

9. The electronic device of claim 1, wherein the display comprises an additional sensing region that is physically separated from the sensing region.

10. The electronic device of claim 9, wherein the additional sensing region has a different size than the sensing region.

11. The electronic device of claim 1, wherein the sensing region overlaps an entire edge of the display.

12. The electronic device of claim 1, wherein the sensing region overlaps a corner of the display.

13. The electronic device of claim 1, wherein the sensing region overlaps a curved edge of the display.

14. The electronic device of claim 1, wherein the sensing region overlaps a recessed notch area in the display.

15. The electronic device of claim 1, wherein the sensing region overlaps an entire surface of the display.

16. The electronic device of claim 1, wherein the second pixels in the sensing region comprise first subpixels of a first color and second subpixels of a second color, and wherein the density of the first subpixels is different than the density of the second subpixels in the sensing region.

17. The electronic device of claim 1, wherein the second pixels in the sensing region comprise blue subpixels and red subpixels, and wherein the density of the blue subpixels is lower than the density of the red subpixels in the sensing region.

18. The electronic device of claim 1, wherein the second pixels in the sensing region comprise green subpixels, blue subpixels, and red subpixels, and wherein the density of the blue subpixels is equal to the density of the blue subpixels and is equal to the density of the red subpixels in the sensing region.

19. The electronic device of claim 1, wherein the diodes of the second size are larger than the diodes of the first size.

20. The electronic device of claim 1, further comprising:
   a conductive touch sensor mesh formed over the display, wherein the conductive touch sensor overlaps with the sensing region.

21. The electronic device of claim 1, further comprising:
   a conductive touch sensor mesh formed over the display, wherein the conductive touch sensor mesh does not overlap with the sensing region.

22. The electronic device of claim 1, wherein the sensing region comprises a plurality of pixel free regions each of which lacks dummy contacts.

23. The electronic device of claim 1, wherein the sensing region comprises a plurality of pixel free regions each of which includes dummy contacts configured to provide emission current uniformity in the sensing region.

24. The electronic device of claim 1, wherein the display comprises a blanket layer that is selectively patterned in the sensing region to increase a transmittance of light through the display to the sensor, and wherein the blanket layer is a display layer selected from the group consisting of: a substrate protection layer, a gate dielectric layer, an inorganic passivation layer, and an organic pixel definition layer.

25. The electronic device of claim 19, wherein the second pixels in the sensing region comprise blue subpixels of a first size and green subpixels of a second size that is smaller than the first size.

26. The electronic device of claim 1, wherein the second pixels of the sensing region comprise green subpixels of a first subpixel density and blue subpixels of a second subpixel density that is equal to the first subpixel density.

27. The electronic device of claim 1, wherein the display comprises a cathode layer that is selectively patterned in the sensing region to increase the transmittance of light through the display to the sensor.

28. A display, comprising:
first pixels of a first pixel density formed in an active area of the display, wherein the first pixels comprise green subpixels of a first subpixel density and blue subpixels of a second subpixel density different than the first subpixel density; and
second pixels of a second pixel density, less than the first pixel density, formed in a given region within the active area, wherein the second pixels comprise green subpixels of a third subpixel density and blue subpixels of a fourth subpixel density equal to the third subpixel density.

* * * * *